(12) United States Patent
Iwane

(10) Patent No.: US 8,194,209 B2
(45) Date of Patent: Jun. 5, 2012

(54) OPTICAL LOW-PASS FILTER, CAMERA, IMAGING APPARATUS, AND METHOD FOR PRODUCING OPTICAL LOW-PASS FILTER

(75) Inventor: Toru Iwane, Yokohama (JP)

(73) Assignee: Nikon Corporation, Tokyo (JP)

( * ) Notice: Subject to any disclaimer, the term of this patent is extended or adjusted under 35 U.S.C. 154(b) by 622 days.

(21) Appl. No.: 12/308,855

(22) PCT Filed: Jul. 4, 2007

(86) PCT No.: PCT/JP2007/063347
§ 371 (c)(1),
(2), (4) Date: Feb. 24, 2009

(87) PCT Pub. No.: WO2008/004570
PCT Pub. Date: Jan. 10, 2008

(65) Prior Publication Data
US 2009/0322970 A1 Dec. 31, 2009

(30) Foreign Application Priority Data

Jul. 5, 2006 (JP) .................................. 2006-185153
Sep. 19, 2006 (JP) .................................. 2006-252805

(51) Int. Cl.
*G02F 1/1333* (2006.01)
*G02F 1/1337* (2006.01)
*G02B 5/22* (2006.01)

(52) U.S. Cl. ............. 349/94; 349/84; 349/125; 359/890

(58) Field of Classification Search .................... 349/84, 349/94, 125; 359/890
See application file for complete search history.

(56) References Cited

U.S. PATENT DOCUMENTS

| | | | | |
|---|---|---|---|---|
| 5,091,795 A | * | 2/1992 | Nishioka et al. | 349/1 |
| 5,097,352 A | * | 3/1992 | Takahashi et al. | 349/57 |
| 5,513,025 A | * | 4/1996 | Watanabe et al. | 349/106 |
| 2005/0207011 A1 | | 9/2005 | Ito et al. | |
| 2006/0256228 A1 | * | 11/2006 | Konno | 348/335 |

FOREIGN PATENT DOCUMENTS

| | | |
|---|---|---|
| JP | A-53-119063 | 10/1978 |
| JP | A-61-126532 | 6/1986 |
| JP | A-6-148572 | 5/1994 |
| JP | 08082799 A * | 3/1996 |
| JP | A-8-82799 | 3/1996 |
| JP | A-2001-4973 | 1/2001 |
| JP | A-2003-121650 | 4/2003 |
| JP | A-2004-163857 | 6/2004 |
| JP | A-2005-331757 | 12/2005 |
| JP | A-2006-30954 | 2/2006 |
| JP | A-2006-48842 | 2/2006 |

* cited by examiner

*Primary Examiner* — Mike Qi
(74) *Attorney, Agent, or Firm* — Oliff & Berridge, PLC

(57) ABSTRACT

An optical low-pass filter is constituted with a liquid crystal substrate including a layer of liquid crystal. The optical low-pass filter includes: a first liquid crystal part in which the liquid crystal is aligned along a first direction; and a second liquid crystal part in which the liquid crystal is aligned along a second direction different from the first direction. The first liquid crystal part and the second liquid crystal part are disposed in an alternately repeated fashion.

17 Claims, 17 Drawing Sheets

FIG.2
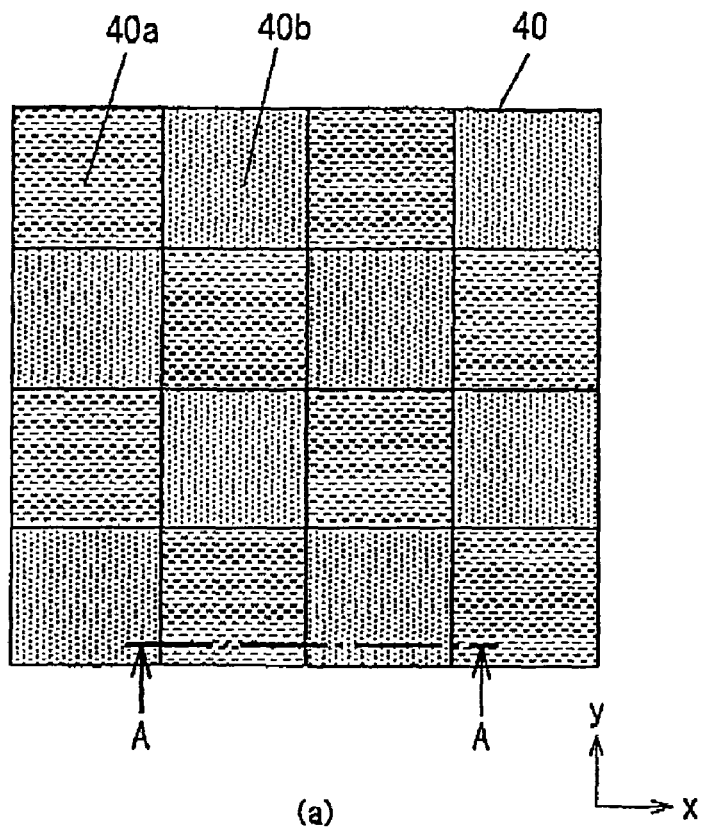
(a)
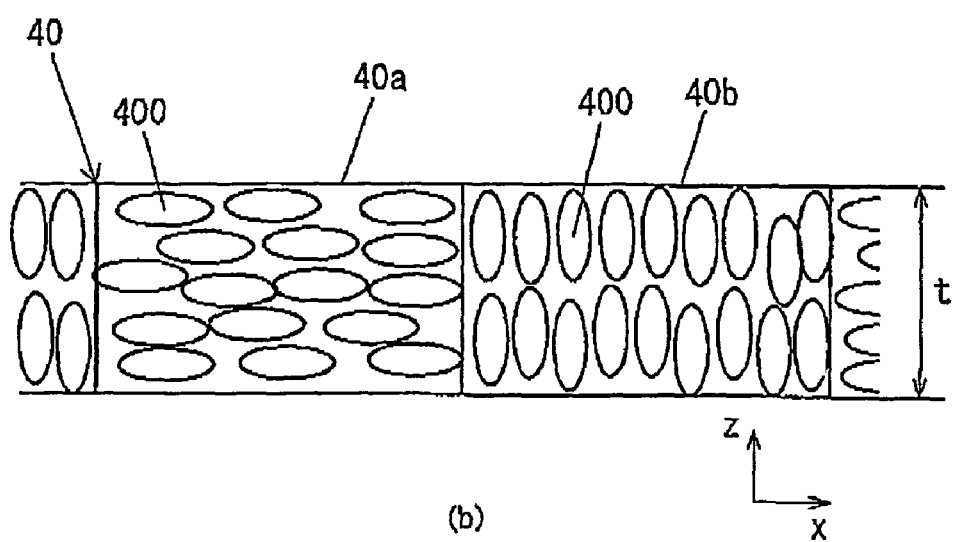
(b)

FIG.4
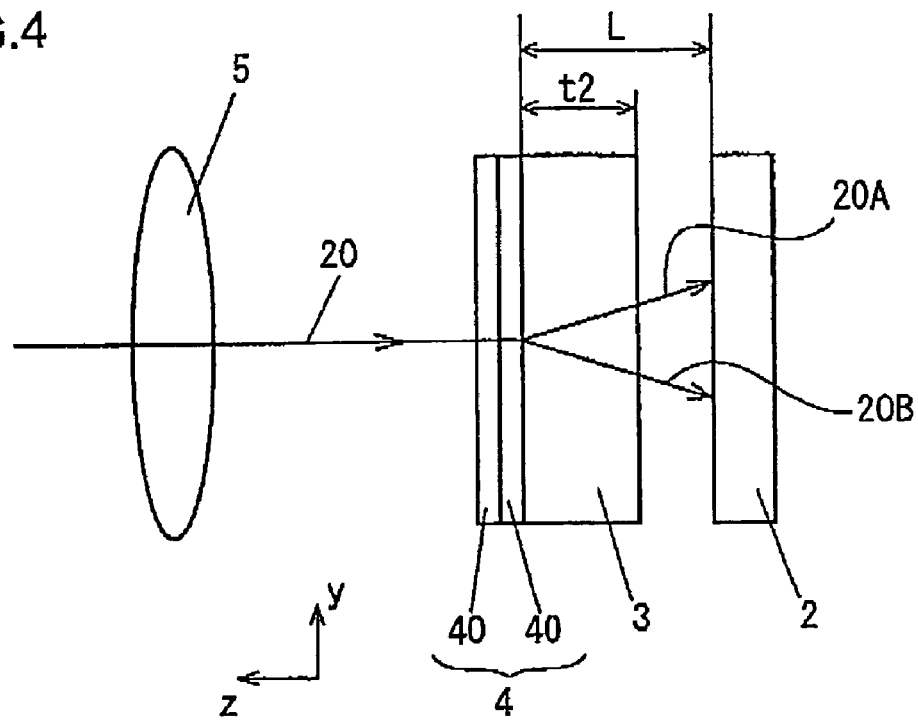
(a)
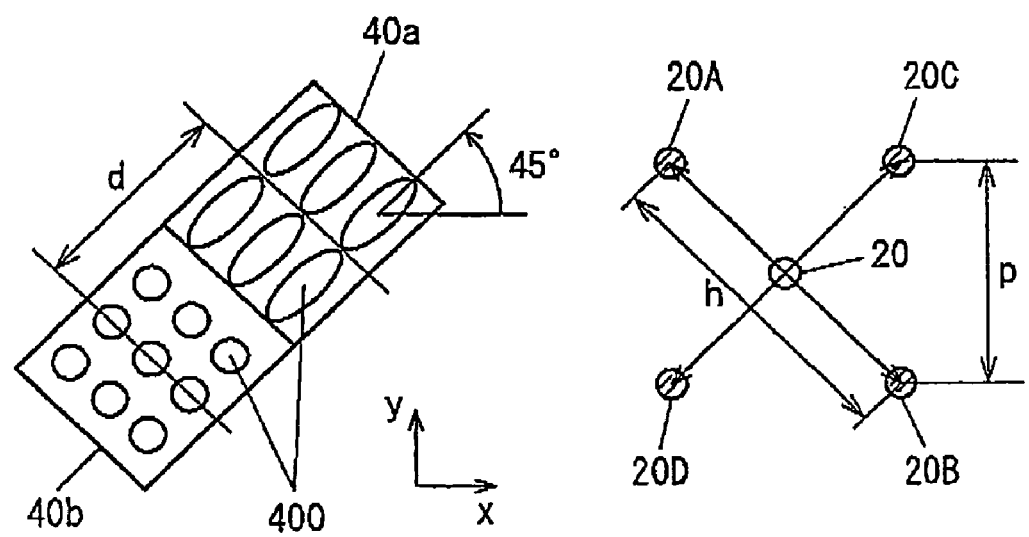
(b)

FIG.5
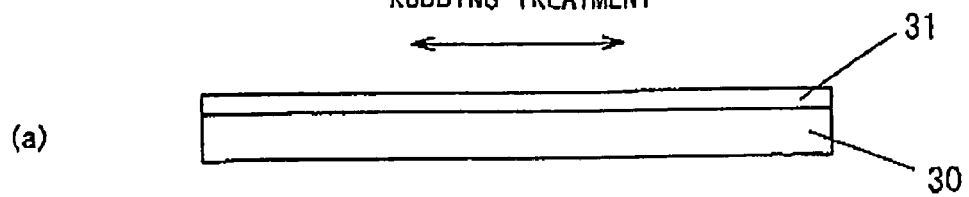
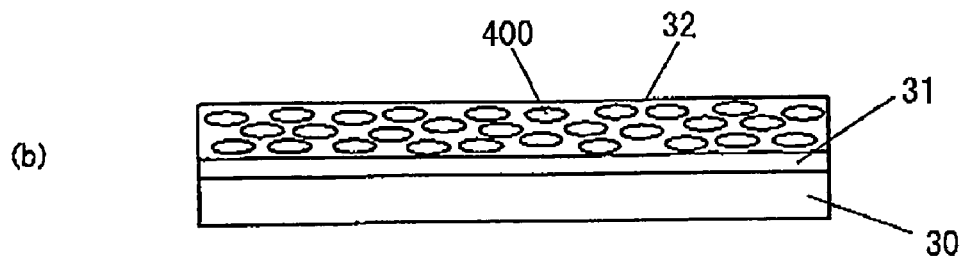
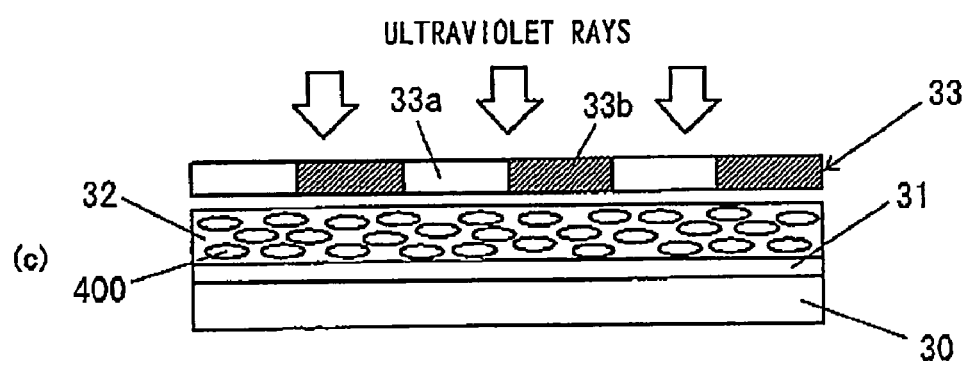
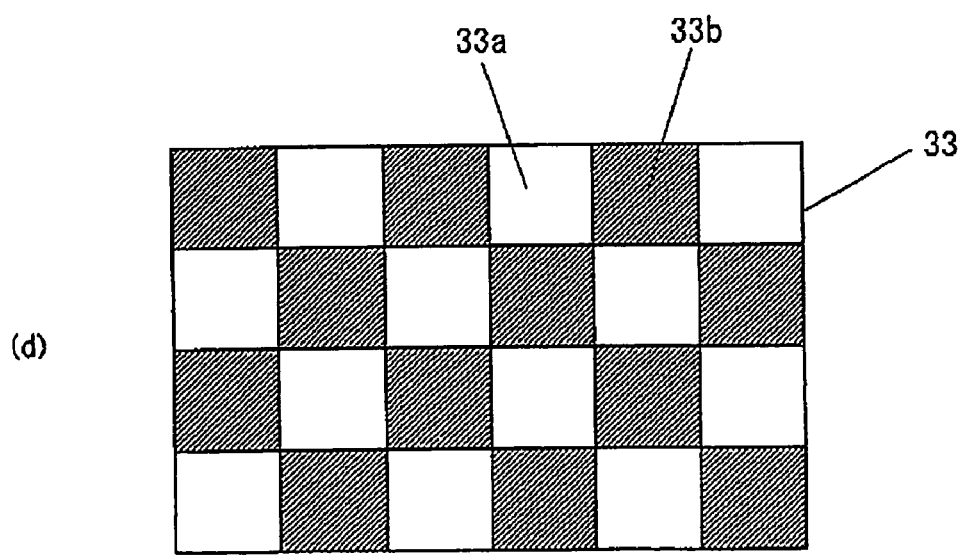

FIG. 7
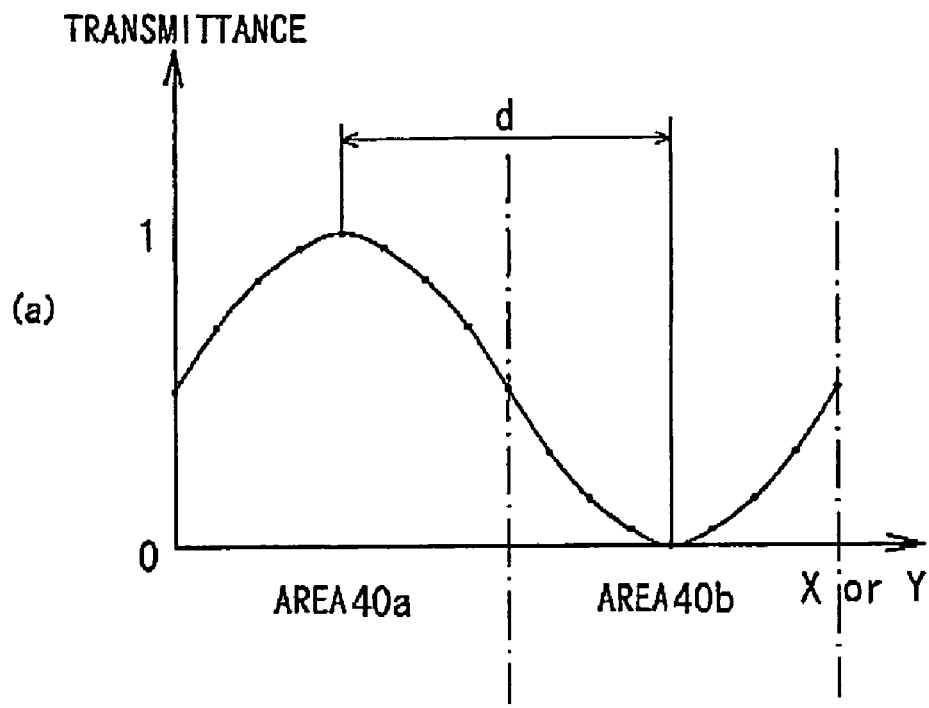
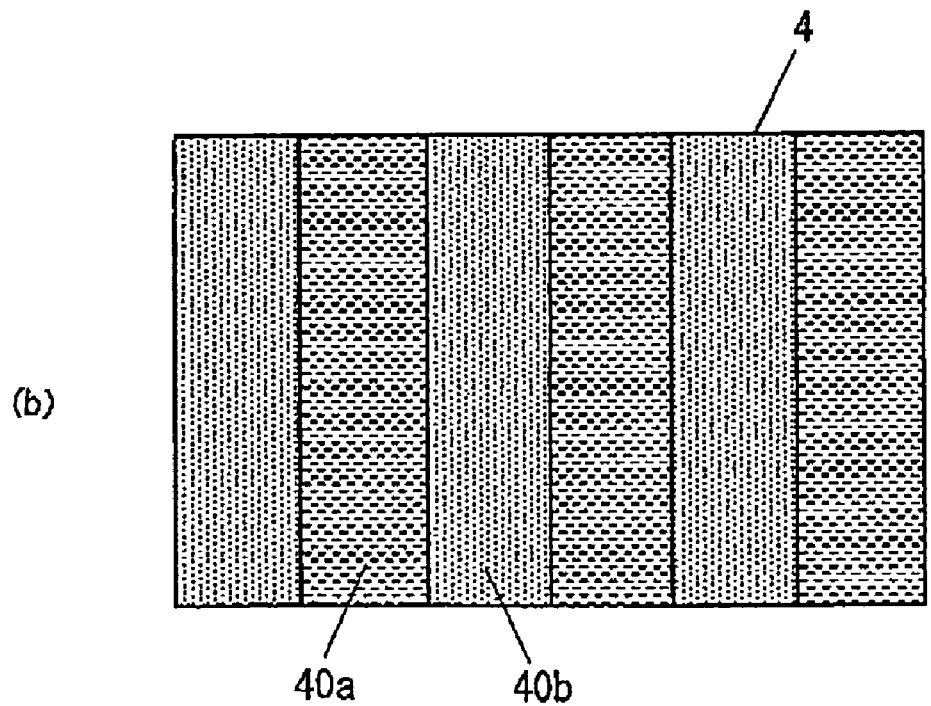

FIG.8
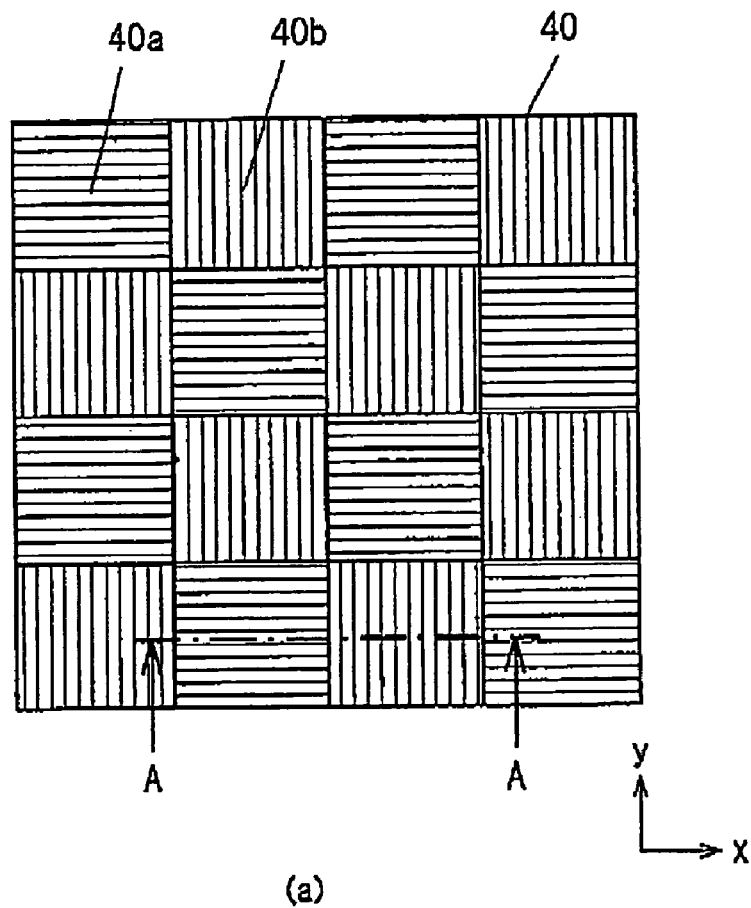
(a)
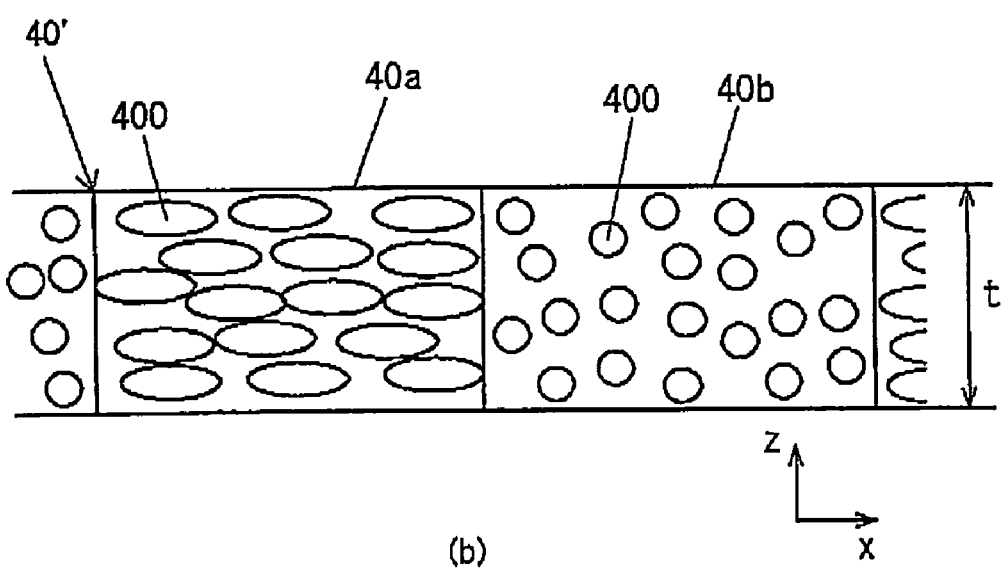
(b)

INDEX ELLIPSOID

FIG.10
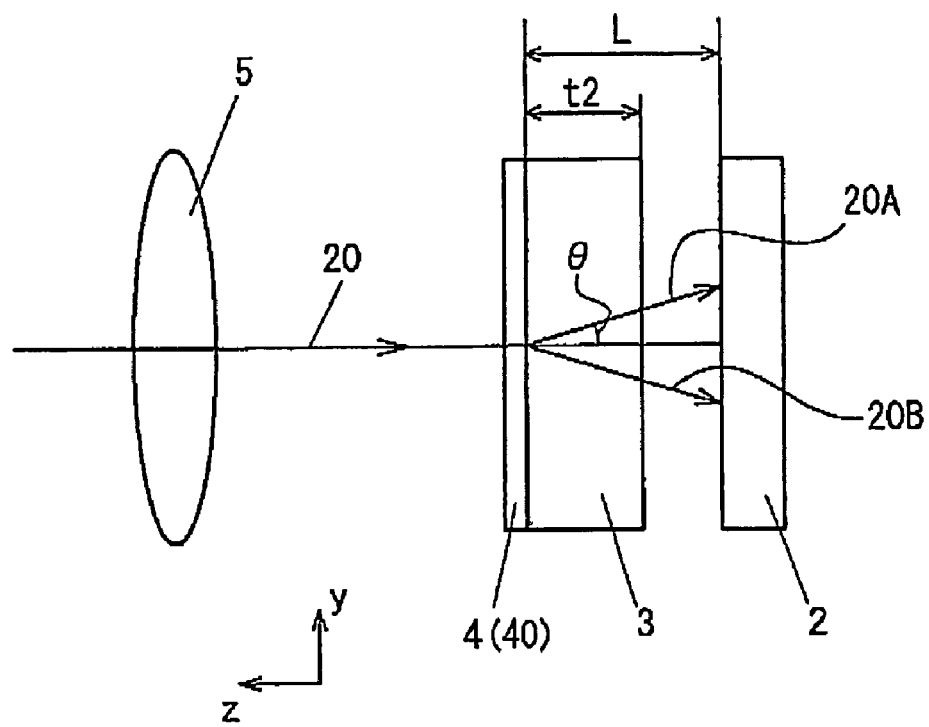
(a)
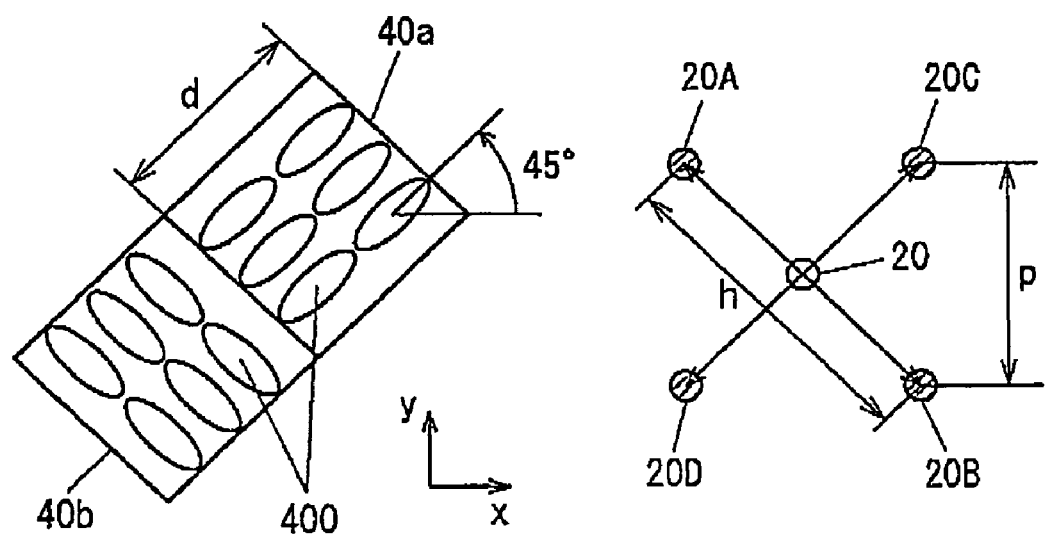
(b)

FIG.15
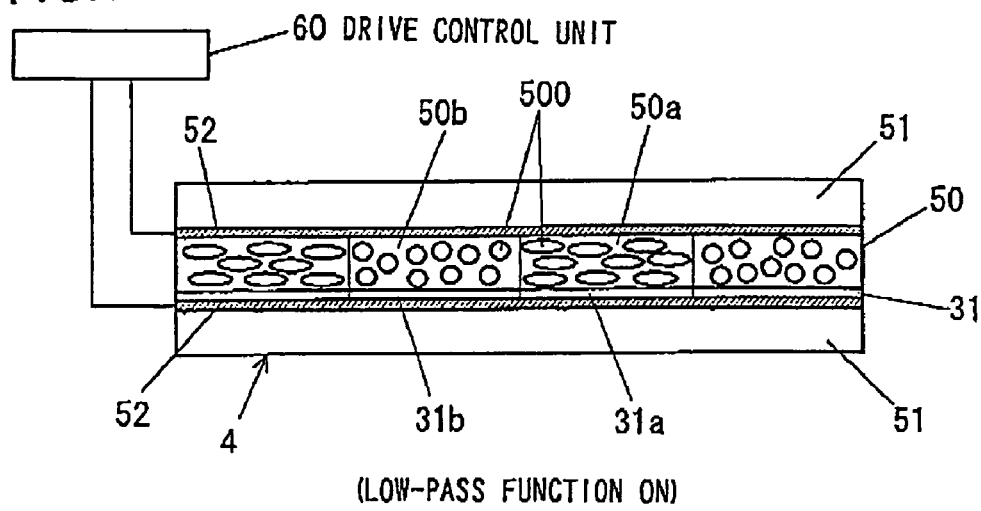
(a)
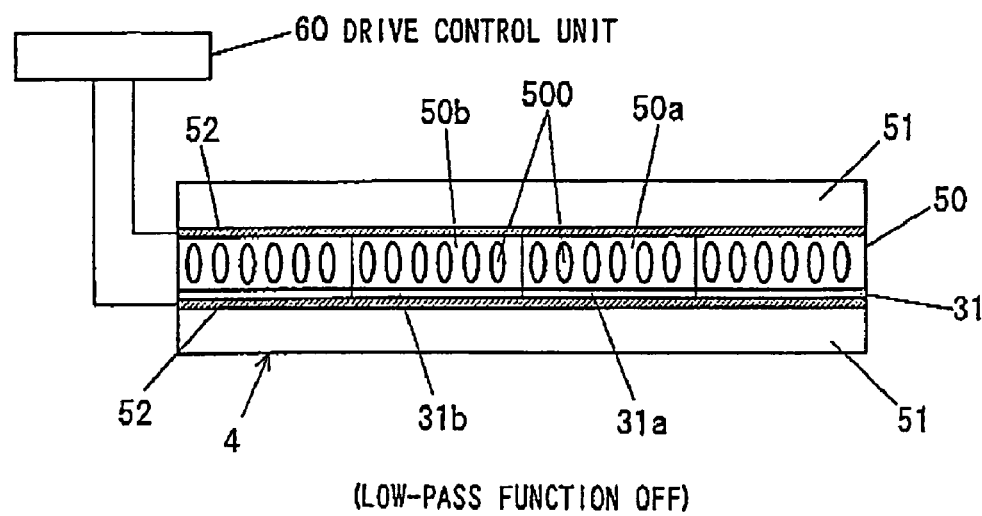
(b)

OPTICAL LOW-PASS FILTER, CAMERA, IMAGING APPARATUS, AND METHOD FOR PRODUCING OPTICAL LOW-PASS FILTER

TECHNICAL FIELD

The present invention relates to an optical low-pass filter using a liquid crystal, a camera or an imaging apparatus equipped with an optical low-pass filter, and a method for producing an optical low-pass filter.

BACKGROUND ART

An electronic camera that performs photography using an image sensor generally is provided with an optical low-pass filter in order to prevent occurrences of moire fringes. As such an optical low-pass filter there has been known an optical low-pass filter that performs image separation utilizing the diffracting action of a diffractive grating of a phase shift type that includes a transparent substrate formed of an uneven relief surface on the surface thereof (see Patent Reference 1).
[Patent Reference 1] Japanese Laid-Open Patent Publication No. H06-148572

DISCLOSURE OF THE INVENTION

Problem to be Solved by the Invention

However, there arises a problem that a vertical edge surface that connects a concave surface and a convex surface with each other is under shadow or reflects total light to become bright as a result of oblique light, so that the pattern of the grating is caught on the imaging plane to adversely affect a captured image. In particular, when the aperture of the photographic lens of a camera is small, a light flux approaches to a vertical parallel light, resulting in that the edge is caught to a considerable extent.

Means for Solving the Problem

The optical low-pass filter with a liquid crystal substrate including a layer of liquid crystal according to a first aspect of the present invention includes: a first liquid crystal part in which the liquid crystal is aligned along a first direction; and a second liquid crystal part in which the liquid crystal is aligned along a second direction different from the first direction, wherein the first liquid crystal part and the second liquid crystal part are disposed in an alternately repeated fashion.

According to a second aspect of the present invention, in the optical low-pass filter according to the first aspect, the liquid crystal may include liquid crystal molecules of a monoaxial index ellipsoid.

According to a third aspect of the present invention, in the optical low-pass filter according to the second aspect, it is preferred that phases of linearly-polarized lights that transmit the first liquid crystal part and the second liquid crystal part, respectively are shifted by a half wavelength.

According to a fourth aspect of the present invention, in the optical low-pass filter according to any one of the first to the third aspects, it is preferred that a plurality of the optical low-pass filters is disposed in superposition one on another such that directions along which the first liquid crystal parts are aligned or directions along which the second liquid crystal parts are aligned are perpendicular to each other.

According to a fifth aspect of the present invention, in the optical low-pass filter according to the first aspect, it is preferred that the liquid crystal in the first liquid crystal part is aligned in a first direction that is parallel to a direction in which a layer of the liquid crystal extends, that the liquid crystal in the second liquid crystal part is aligned in a second direction perpendicular to the first direction within the direction in which the layer of the liquid crystal extends, and that the first liquid crystal part and the second liquid crystal part are disposed in an alternately repeated fashion along the direction in which the layer of the liquid crystal extends.

According to a sixth aspect of the present invention, in the optical low-pass filter according to any one of the first to the fifth aspects, the liquid crystal may be optically a monoaxial crystal and a thickness of the layer of the liquid crystal may be determined based on a difference between an ordinary refractive index and an extraordinary refractive index of the monoaxial crystal and a wavelength of an incident light flux.

According to a seventh aspect of the present invention, in the optical low-pass filter according to the fifth or sixth aspect, it is preferred that the layer of the liquid crystal is formed on an aligning film in which a portion where the liquid crystal is aligned in the first direction and a portion where the liquid crystal is aligned in the second direction are disposed in an alternately repeated fashion.

According to an eighth aspect of the present invention, in the optical low-pass filter according to the any one of the first to the seventh aspects, the layer of the liquid crystal may include a nematic liquid crystal sandwiched by a pair of substrates each of which is formed with an electrode.

According to a ninth aspect of the present invention, the optical low-pass filter according to the eighth aspect may further include: a control circuit that controls voltage applied to the electrodes.

According to a tenth aspect of the present invention, in the optical low-pass filter according to any one of the first to the ninth aspects, a ratio of widths of the alternately disposed liquid crystal parts may be set to vary sinusoidally.

The imaging apparatus according to an eleventh aspect of the present invention includes the optical low-pass filter according to any one of the first to the ninth aspects: and a light receiving element that receives imaging light through the optical low-pass filter.

According to a twelfth aspect of the present invention, in the imaging apparatus according to the eleventh aspect, pitches of adjacent different liquid crystal parts in the liquid crystal substrate may be set according to a width of separation required based on a distance between the optical low-pass filter and the light receiving element and a pixel pitch of the light receiving element.

According to a thirteenth aspect of the present invention, in the imaging apparatus according to the eleventh or twelfth aspect, a plurality of the optical low-pass filters may be provided for each of linearly-polarized lights that are perpendicular to each other.

The camera according to a fourteenth aspect of the present invention includes: an optical low-pass filter according to any one of the first to the tenth aspects; and an image sensor that receives subject light through the optical low-pass filter.

According to a fifteenth aspect of the present invention, in the camera according to the fourteenth aspect, a plurality of the optical low-pass filters may be provided for each of linearly-polarized lights that are perpendicular to each other.

The method for producing an optical low-pass filter according to a sixteenth aspect of the present invention includes: disposing on a liquid crystal substrate having a layer of a liquid crystal a first liquid crystal part and a second liquid crystal part in an alternately repeated fashion with directions along which the liquid crystal is aligned being different from one another.

According to a seventeenth aspect of the present invention, the method for producing an optical low-pass filter according to the sixteenth aspect may include: a first step of bringing liquid crystal molecules of monoaxial index ellipsoid included in an ultraviolet-curing liquid crystal into a first alignment state to provide the first liquid crystal part; a second step of irradiating ultraviolet rays to the ultraviolet-curing liquid crystal using a mask that partially transmits ultraviolet rays to form a cured area and a non-cured area; and a third step of bringing the liquid crystal molecules in the non-cured area into a second alignment state and curing the non-cured area by irradiation of ultraviolet rays to provide the second liquid crystal part.

According to an eighteenth aspect of the present invention, in the method for producing an optical low-pass filter according to the first aspect, any one of the first and the second alignment states may be a nonaligned state in which liquid crystal molecules in the area are aligned in an at random direction.

According to a nineteenth aspect of the present invention, in the method for producing optical low-pass filter according to the first aspect, the ultraviolet rays in the second step may be irradiated through one of a mask in which a part transmitting ultraviolet rays and a part shielding ultraviolet rays are disposed in a checkered pattern and a gradation mask of which ultraviolet transmittance gradually varies along a mask surface.

According to a twentieth aspect of the present invention, the method for producing optical low-pass filter according to the sixteenth aspect may further include: a first step of forming a photoaligning agent on a substrate; a second step of exposing the photoaligning agent to light through a mask in which areas having different transmittances corresponding to the first liquid crystal part and the second liquid crystal part, respectively, are alternately disposed; a third step of exposing an area of the photoaligning agent that has not been exposed in the second step; and a fourth step of forming a layer of liquid crystal on the photoaligning agent.

Advantageous Effect of the Invention

According to the present invention, the grating pattern can be prevented from being caught when an optical low-pass filter is used.

BRIEF DESCRIPTION OF THE DRAWINGS

FIG. 2(a) is a schematic plan view showing the structure of the liquid crystal film 40 that constitutes the optical low-pass filter 4 and FIG. 2(b) is an A-A cross-section;

FIG. 4(a) is a diagram illustrating separation of a light flux by an optical low-pass filter and FIG. 4(b) is a diagram illustrating the relationship between disposition of each area and a direction in which the light flux is separated;

FIGS. 5(a) to 5(d) each are a diagram illustrating a method for producing a liquid crystal film, with FIGS. 5(a) to 5(c) illustrating the first step to the third step and FIG. 5(d) illustrating the fifth step;

FIG. 7(a) is a diagram illustrating the transmittance distribution of a gradation mask and FIG. 7(b) is a diagram showing the optical low-pass filter according to another example;

FIG. 8(a) is a schematic diagram showing the structure of the liquid crystal film and FIG. 8(b) an A-A cross-section;

FIG. 10(a) is a diagram illustrating separation of a light flux by an optical low-pass filter and FIG. 10(b) is a diagram illustrating the relationship between disposition of each area and a direction in which the light flux is separated;

FIGS. 15(a) and 15(b) each are a diagram illustrating a first modification, with FIG. 15(a) illustrating a state in which the low-pass function is ON and FIG. 15(b) illustrating a state in which the low-pass function is OFF;

BEST MODE FOR CARRYING OUT THE INVENTION

First Embodiment

Figure 1:
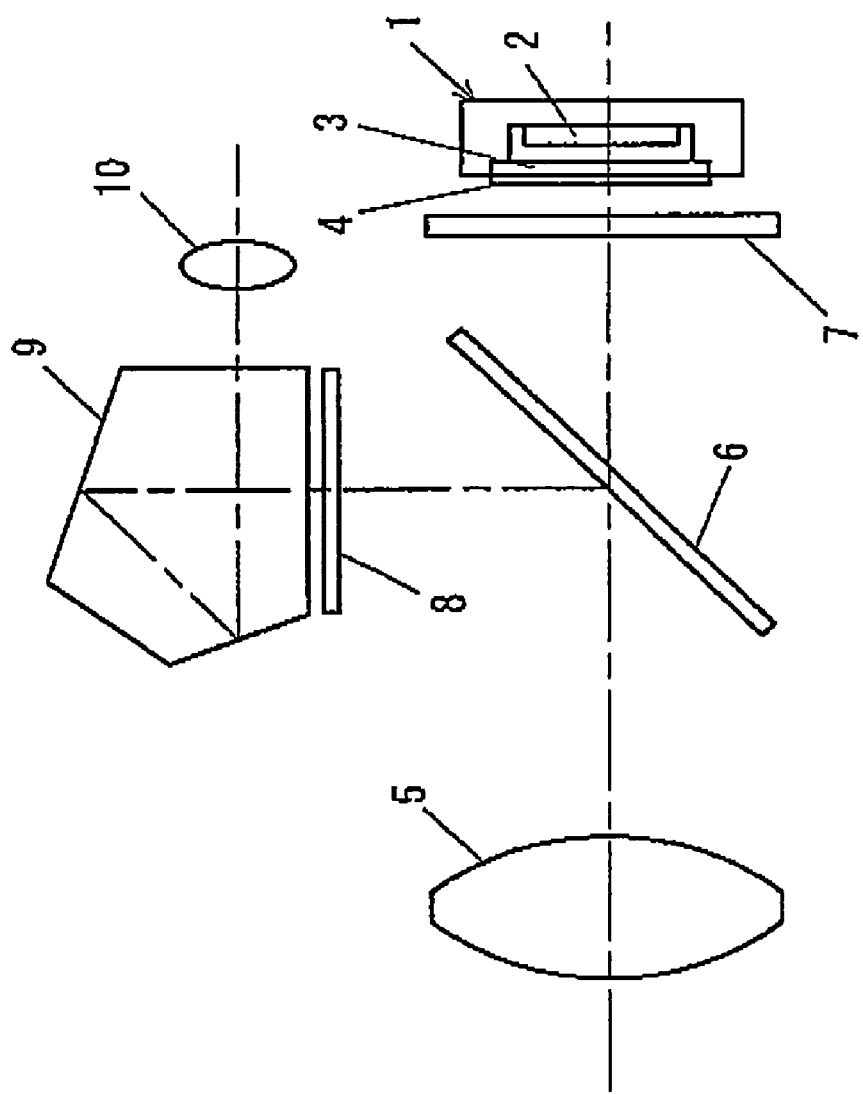
FIG. 1 is a diagram showing a camera according to a first embodiment of the present invention, illustrating a schematic construction of the camera.

Hereinafter, best modes for carrying out the present invention are described with reference to the attached drawings. FIG. 1 is a diagram showing a camera according to a first embodiment of the present invention, showing a schematic construction of the camera. An imaging apparatus 1 is provided with an image sensor 2 that captures a subject image formed by a photographic lens 5. The image sensor 2 is a light-receiving element that receives imaging light (light from a subject). Examples of the image sensor 2 that can be used include a CCD image sensor, a CMOS image sensor, and so on. A cover glass 3 is to protect the image sensor 2 and an optical low-pass filter 4 is applied to a surface of the cover glass 3.

A main mirror 6 and a shutter 7 are provided between the imaging apparatus 1 and the photographic lens 5. Upon exposure, the main mirror 6 is driven to retreat to outside of the optical path and the shutter 7 is opened. As a result, the subject image is captured by the image sensor 2. On the other hand, upon non-exposure, the subject light from the photographic lens 5 is reflected at the main mirror 6 to form an image on a finder screen 8 disposed at a point optically equivalent to the imaging plane. The subject image formed on the finder screen 8 is viewed as a finder image via a pentaprism 9 and an eyepiece 10.

FIGS. 2(a) and 2(b) each are a schematic diagram showing the construction of a liquid crystal film 40 that constitutes the optical low-pass filter 4. FIG. 2(a) is a plan view and FIG. 2(b) is an A-A cross-section. As described later, the optical low-pass filter 4 according to the present embodiment is formed by using two sheets of the liquid crystal film 40 one on the other. The liquid crystal film 40 is made of an ultraviolet-curing liquid crystal that is cured by irradiation of ultraviolet rays. Liquid crystal molecules 400 contained in the ultraviolet-curing liquid crystal have characteristics of a monoaxial index ellipsoid. In the liquid crystal film 40, two types of rectangular areas 40a and 40b having different alignment directions of liquid crystal molecules 400 (that is, alignment directions of index ellipsoids) are disposed in an alternately repeated fashion in the x direction and in the y direction.

As shown in the cross-sectional view in FIG. 2(b), the alignment direction of the liquid crystal molecules 400 in the area 40a is the x direction, which is substantially parallel to a substrate plane (xy plane). On the other hand, in the area 40b, the liquid crystal molecules 400 are aligned substantially vertically with respect to the substrate plane. In the case of liquid crystal having optical anisotropy of a monoaxial index ellipsoid, the alignment direction of the index ellipsoid is substantially identical with the alignment direction of the liquid crystal molecules 400. The liquid crystal film 40 is formed by aligning the liquid crystal molecules 400 in the direction as shown in FIG. 2(b) and curing the liquid crystal by irradiation of ultraviolet rays.

Figure 3:
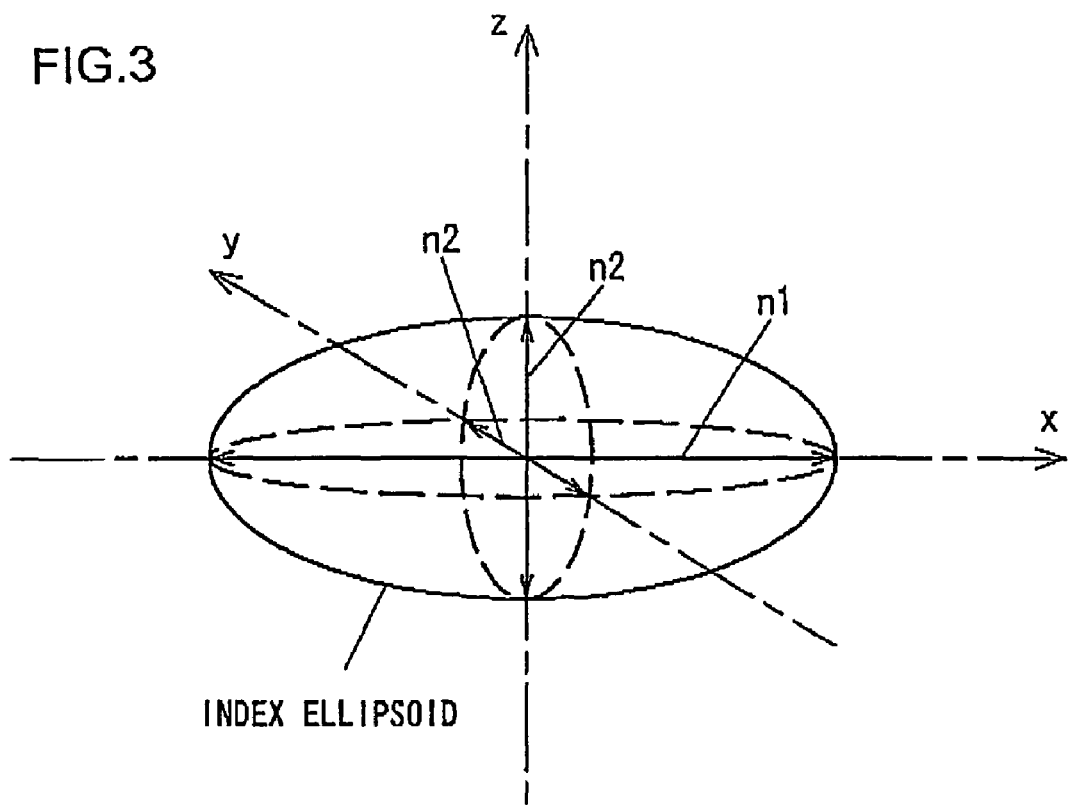
FIG. 3 is a diagram illustrating an index ellipsoid.

The index ellipsoid is in the form of a spheroid as shown in FIG. 3. Its diameter in the direction of rotation axis (direction of x axis) indicates an extraordinary refractive index $n1$ and its diameters in directions perpendicular to the rotation axis (direction of y axis, direction of z axis) indicate an ordinary refractive index $n2$. Note that the index ellipsoid shown in FIG. 3 represents one that is related to the area 40a in FIG. 2(b) and it is assumed that $ny=nz$ and $n1>n2$. In the area 40b, the longer axis of the index ellipsoid is along a direction vertical to the substrate (z direction).

When a light is incident into the area 40a along the direction of z plus, the liquid crystal film 40 has a refractive index $n1$ for linearly-polarized light that oscillates in the x direction and $n2$ for linearly-polarized light that oscillates in the y direction. On the other hand, when light is incident into the area 40b along the direction of z plus, the liquid crystal film 40 has a refractive index $n2$ for both the linearly-polarized light that oscillates in the x direction and the linearly-polarized light that oscillates in the y direction. In other words, the liquid crystal film 40 is merely a transparent substrate for the linearly-polarized light that oscillates in the y direction but it has a function of a diffractive grating for the linearly-polarized light that oscillates in the x direction.

That is, a phase difference of $t \cdot (n1-n2)$ occurs between the light having passed through the area 40a and the light having passed through the area 40b for the linearly-polarized light in the x direction. Here, t indicates a thickness of the liquid crystal film 40. If the phase difference is set to be a half of the wavelength of the light, a zero-order diffracted light becomes null and the liquid crystal film 40 functions as a low-pass filter due to separation of light flux into ±1st-order diffracted lights. Note that ±2nd-order or higher order diffracted lights are also generated. However, their intensities are very low, so that it may be considered that the optical low-pass filter is based substantially on the ±1st-order diffracted lights Since the areas 40a and 40b are disposed in an alternately repeated fashion along the x direction and the y direction in the liquid crystal film 40, the light flux is separated in two directions, i.e., into the x direction and the y direction.

For example, when $n1-n2=0.1$ and a wavelength λ of the light is λ=540 nm, the thickness t may be set as indicated by the following expression (1).

$$t=\lambda/(2(n1-n2))=2.7(\mu m) \quad (1)$$

The expression (1) indicates the thickness when the phase difference is λ/2. Generally, it is established that (amount of phase variation)=$(2n+1)\pi$ and hence a desired thickness may be selected by setting n to be 0, 1, 2, 3, 4, . . . in the following expression (2).

$$t=\lambda(2n+1)/(2(n1-n2)) \quad (2)$$

Since the liquid crystal molecules 400 in the area 40a are disposed in the x direction in the liquid crystal film 40 shown in FIGS. 2(a) and 2(b), only the linearly-polarized light in the x direction is separated into two directions If the liquid crystal film 40 shown in FIGS. 2(a) and 2(b) is rotated by 90 degrees around the z axis, the liquid crystal molecules 400 in the area 40a come to be aligned in the y direction. Therefore, in such a disposition, unlike the disposition shown in FIG. 2(a), the linearly-polarized light in the y direction will be separated.

That is, if two sheets of the liquid crystal film 40 are layered one on the other such that the liquid crystal molecules 400 in the areas 40a are perpendicular to each other, the incident light will be separated in two directions regardless of the direction of polarization of the incident light. Note that when the liquid crystal films 40 are layered one on the other, the areas 40a and the areas 40b, respectively, do not have to be placed one on the other. In the optical low-pass filter 4 shown in FIG. 1, two sheets of the liquid crystal film 40 shown in FIGS. 2(a) and 2(b) are attached to the cover glass 3 such that the alignment directions of the liquid crystal molecules 400 in the area 40a are perpendicular to each other.

Next, the width of separation of a light flux caused by the optical low-pass filter 4 is described with reference to FIGS. 4(a) and 4(b). Note that while the optical low-pass filter 4 includes two sheets of the liquid crystal film 40 one on another, the filter function of one of the liquid crystal films 40 on one of the linearly-polarized lights perpendicular to each other and the filter function of the other of the liquid crystal films 40 on the other of the linearly-polarized lights are quite the same.

In the first embodiment, it is assumed that pixels in the image sensor 2 are disposed in the x direction and in the y direction in the form of a matrix and the optical low-pass filter 4 separates a light flux along the direction in which the pixels are disposed. That is, as shown in FIG. 4(a), the light flux 20 incident to the optical low-pass filter 4 via the photographic lens 5 is separated by the optical low-pass filter 4 into two directions, i.e., into the x direction and the y direction. The separated light fluxes are incident to the imaging plane of the image sensor 2 through the cover glass 3.

FIG. 4(b) illustrates the positional relationship between separated light fluxes 20A to 20D and the disposition of the areas 40a and 40b on the imaging plane. When the areas 40a and 40b are disposed in the xy directions as shown in FIG. 2(a), the direction in which the light flux is separated will be separated in a cross shape. On the other hand, since the direction in which the pixels on the image sensor 2 is disposed is in the xy directions, it is necessary to dispose the liquid crystal films 40 such that the area 40b is positioned at 45 degrees with respect to the area 40a as shown in FIG. 4(b) in order for four light fluxes after separation to be positioned at the vertices of a square in compliance with the disposition of the pixels.

On that occasion, the direction in which the light flux is separated is oblique by 45 degrees, so that the light fluxes 20A to 20D are aligned at the vertices of a square having a side length equal to a pixel pitch p. Therefore, the separation width h must be h=p√2. Assuming that the cover glass 3 has a thickness t2 and a refractive index of nd and the distance between the optical low-pass filter 4 and the imaging plane is L, an optical distance L' from the optical low-pass filter 4 to the imaging plane is expressed by the following expression (3).

$$L' = t2 + (L-t2) \cdot nd \quad (3)$$

FIG. 4(a) indicates that the separation width h on the imaging plane depends on the optical distance from the optical low-pass filter 4 to the imaging plane. Therefore, a repetition pitch d at which the areas 40a and 40b are repeated is calculated according to the following expression (4). λ is the wavelength of a light. For example, assuming that the pixel pitch p=2 μm, the distance L=1 mm, the thickness of the cover glass 3 t2=0.5 mm, the refractive index nd=1.5, and λ=540 nm, the repetition pitch d of the areas 40a and 40b is d≈0.477 mm. Therefore, the length of one side of the square areas 40a and 40b is 0.477 mm.

$$d = 2\lambda \cdot L'/h$$

$$d = 2\lambda \cdot (t2 + (L-t2)nd)/(p\sqrt{2}) \quad (4)$$

[Method for Producing Liquid Crystal Film 40]

Next, a method for producing the liquid crystal film 40 is roughly explained. First, in a first step illustrated in FIG. 5(a), an aligning film (polyimide film or the like) 31 is formed on a planar substrate 30 by coating and a rubbing treatment is performed to the aligning film 31. Here, a rubbing treatment is performed so that liquid crystal molecules are oriented in the direction of left and right in the figure. In a second step illustrated in FIG. 5(b), monomeric ultraviolet-curing liquid crystal is spread in the form of a film on the aligning film 31 to form a liquid crystal layer 32. The liquid crystal molecules 400 in the liquid crystal layer 32 are aligned in the alignment direction of the aligning film 31 and the liquid crystal molecules 400 are aligned such that the longer axes thereof are substantially parallel to the substrate surface of the planar substrate 30.

The liquid crystal layer 32 is formed by a method in which liquid crystal is spread to a predetermine thickness on the aligning film 31 by using a spreading device such as a spin coater. Here, the predetermined thickness means the thickness t of the liquid crystal film 40. Note that preferably, the thickness t of the liquid crystal layer 32 is determined based on a difference between the ordinary refractive index and the extraordinary refractive index of the monoaxial crystal and the wavelength of the incident light flux. Further, the liquid crystal may be injected into a space between a pair of transparent substrates disposed at a predetermined distance via a spacer like a conventional liquid crystal panel. In this case, the aligning film 31 is formed on at least one of the transparent substrates.

Figure 6:
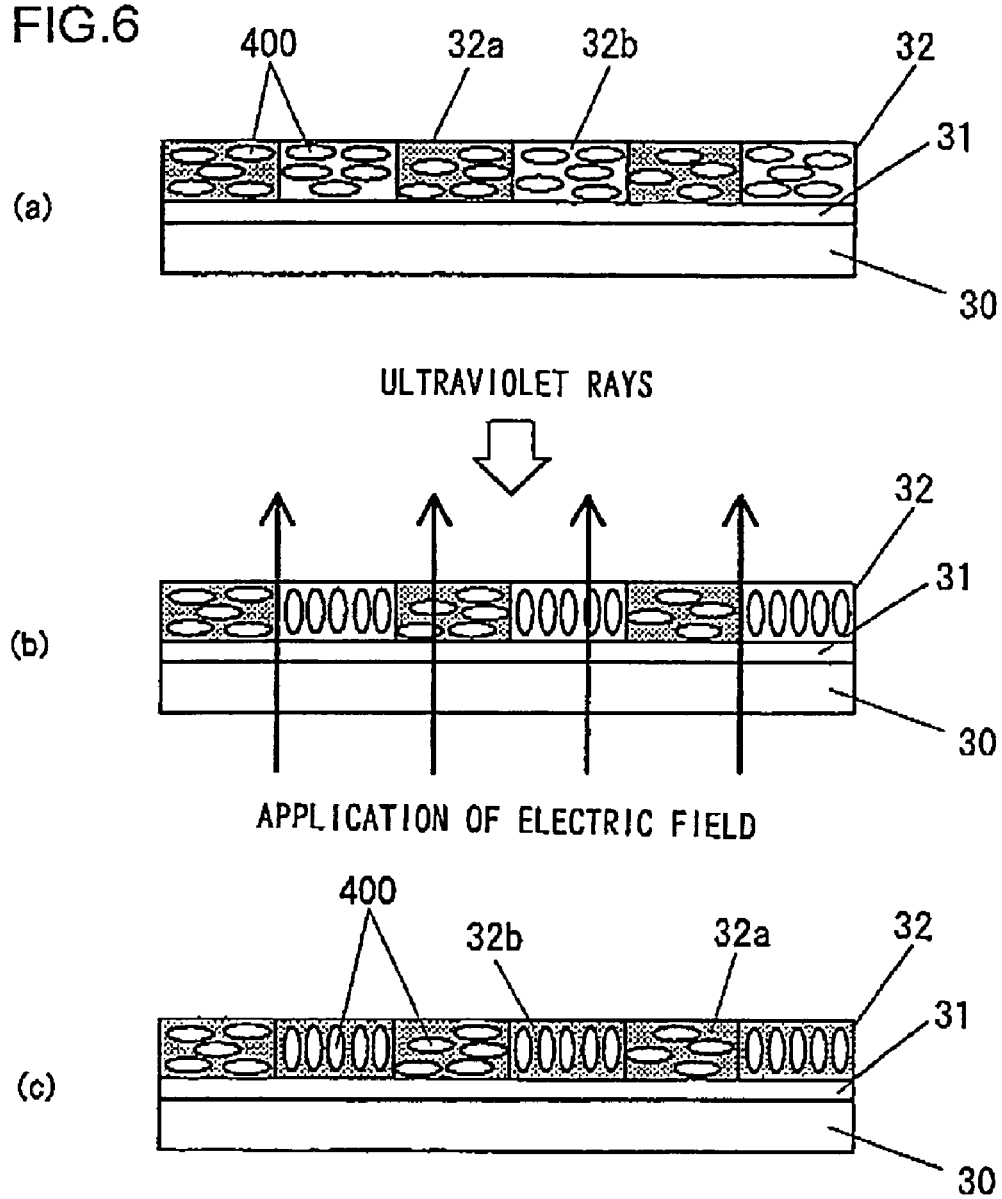
FIG. 6(a) to FIG. 6(c) each are a diagram illustrating a method for producing a liquid crystal film, with FIG. 6(a) showing the liquid crystal layer after the third step, FIG. 6(b) illustrating the fourth step, and FIG. 6(c) showing the liquid crystal layer after the fourth step.

In a third step illustrated in FIG. 5(c), the liquid crystal layer is exposed to ultraviolet rays by using a mask 33. FIG. 5(d) is a plan view of the mask 33, in which ultraviolet-transmitting areas 33a and ultraviolet-ray non-transmitting areas 33b, each being rectangular, are disposed in a checkered pattern. On this occasion, the exposure may be of a type in which the mask 33 is in contact with the exposure side or a type in which an image of the mask is projected on the exposure surface by using an optical system. FIG. 6(a) shows the liquid crystal layer 32 after curing. In the area 32a on which ultraviolet ray is irradiated (area opposite to the ultraviolet-ray transmitting area 33a), the monomeric state is cured into a polymeric state, and the alignment direction of the liquid crystal molecules 400 is fixed to a direction parallel to the substrate. In the area 32b which the ultraviolet non-transmitting area 33b faces, the liquid crystal remains in a non-cured state.

In a fourth step illustrated in FIG. 6(b), an electric field in a direction vertical to the planar substrate 30 is applied to forcibly orient the liquid crystal molecules 400 in the area 32b in which the liquid crystal is in a non-cured state along the vertical direction. Then, in that state, ultraviolet rays are irradiated to cure the liquid crystal in the area 32b to fix the alignment direction of the liquid crystal molecules 400 to the direction vertical to the substrate. As a result, as shown in FIG. 6(c), the liquid crystal layer 32 provided with the area 32a having alignment characteristics of being parallel to the substrate 30 and the area 32b having alignment characteristics of being vertical to the substrate 30. By peeling the liquid crystal layer 32 from the substrate 30, the liquid crystal film 40 as shown in FIGS. 2(a) and 2(b) is obtained. Here, the areas 32a and 32b of the liquid crystal layer 32 correspond to the areas 40a and 40b of the liquid crystal film 40, respectively.

Note that instead of applying electric field to the liquid crystal molecules 400 in the area 32b in which the liquid crystal is in a non-cured state to have them aligned in the direction vertical to the substrate, the liquid crystal may be brought into a high temperature state to make the area 32b to be in an isotropic state and then cured with ultraviolet rays. For example, the planar substrate 30 on which the liquid crystal layer 32 in which the area 32b is in a non-cured state is heated to an elevated temperature by using an incubator or the like and then ultraviolet rays are irradiated. Nematic liquid crystal ceases to be a liquid crystal having optical anisotropy and is brought into a state of isotropic liquid when the temperature exceeds a certain level. Therefore, the liquid crystal in a non-cured state in the area 32b loses optical characteristics as liquid crystal to become a substance having a predetermined refractive index at high temperatures. Then, by irradiation of ultraviolet rays thereon, the isotropic state of the area 32b is fixed. On this occasion, the area 32a has alignment characteristics of being parallel to the substrate while the area 32b becomes an area that has no alignment characteristics.

In the above-mentioned third step, use has been made of the mask 33 in which transmitting parts and shielding parts with respect to ultraviolet rays are disposed in a checkered pattern. However, use may be made of a gradation mask of which the ultraviolet transmittance gradually varies in the x direction and the y direction as shown in FIG. 7(a). In the example shown in FIG. 7(a) the ultraviolet transmittance varies like a sine curve. As mentioned above, use of a mask whose ultraviolet transmittance varies gradually results in gradual changes in position and intensity of irradiated ultraviolet rays, and according as the intensity of ultraviolet rays is decreased, the ratio of non-cured area mixed gradually increases. As a result, the optical performance is increased.

The operational effects of the above-mentioned first embodiment are summarized as follows.

(1) In the optical low-pass filter 4 that includes a liquid crystal substrate containing liquid crystal molecules of monoaxial index ellipsoid (liquid crystal film 40), the first area 40a and the second area 40b having alignment directions of index ellipsoids different from each other are in an alternately repeated fashion. This can prevent the grating pattern from being caught in the imaging plane in case of the optical low-pass filter utilizing a diffractive action. An attempt of die-forming a phase diffractive grating having formed with a relief of concaves and convexes would result in an increase in cost because of difficulty in forming the die since the dimension of the concaves and convexes is on the order of wavelengths. On the other hand, in the liquid crystal film 40 in the first embodiment can be produced without difficulty to achieve cost reduction since a liquid crystal layer having a uniform thickness is formed and the areas 40a and 40b are formed therein by irradiation of ultraviolet rays.

(2) The intensity of 0-order light can be made approximately null by staggering the light path in the first area 40a and the light path in the second area 40b by approximately a half of the wavelength for linearly-polarized light. Further, the optical low-pass filter can operate regardless of the direction of polarized light by layering a plurality of liquid crystal films 40 one on another such that the first areas and the second areas, respectively, are aligned in alignment directions perpendicular to each other.

(3) An optical low-pass filter adopting ultraviolet-curing liquid crystal can be provided by a method for producing an optical low-pass filter including a first step in which liquid crystal molecules 400 of monoaxial index ellipsoids are brought into a state of a first oriented state, a second step in which ultraviolet rays are irradiated to ultraviolet-curing liquid crystal by using the mask 33 that partially transmits ultraviolet rays to form the cured area 32a and the non-cured area 32b, and a third step in which the liquid crystal molecules 400 in the non-cured area 32b are brought into a second oriented state and the non-cured area 32b is cured by irradiation of ultraviolet rays.

(4) Note that any one of the first and the second alignment state may be set to be a non-alignment state, in which the liquid crystal molecules 400 in the area each are oriented in at random direction. Further, in the second step, the mask 33 in which the transmitting parts 33a and the shielding parts 33b with respect to the ultraviolet rays are disposed in a checkered pattern or the gradation mask of which the ultraviolet transmittance gradually varies along the surface of the mask may be used.

(5) In a camera equipped with the above-mentioned optical low-pass filter and an image sensor that receives subject light via the optical low-pass filter, and an imaging apparatus equipped with the above-mentioned optical low-pass filter and a light-receiving element that receives image-capturing light via the optical low-pass filter, the pitch at which adjacent different areas on the liquid crystal substrate are disposed may be set in compliance with a separation width required based on the distance between the optical low-pass filter and the image sensor, and pixel pitch on the image sensor.

In the above-mentioned first embodiment, the light flux is separated into two directions, i.e., the x direction and the y direction by disposing the areas 40a and 40b alternately in the x direction and the y direction. However, as shown in FIG. 7(b), the linear areas 40a and 40b may be alternately disposed only in either one of the x direction and the y direction to separate the light flux in one direction.

Further, instead of attaching the liquid crystal film 40 to the cover glass 3, two layers of the liquid crystal may be formed directly on the surface of the cover glass 3. That is, a liquid crystal layer of a predetermined thickness is formed on the cover glass 3 by using a spin coater to form the liquid crystal layer 32 as shown in FIG. 6(c). Further, a liquid crystal layer is formed on the liquid crystal layer 32 by using the spin coater to form the second liquid crystal layer 32 such that the alignment direction of the area 32a of the second liquid crystal layer 32 is perpendicular to the alignment direction of the area 32a of the underlying liquid crystal layer 32. Note that the above-explanation is only exemplary and the present invention is not limited to the above-mentioned embodiment as far as the feature of the present invention is not damaged.

Second Embodiment

Next, a second embodiment of the present invention is explained with reference to the attached drawings. The following explanation is focused on differences between the above-mentioned first embodiment and the second embodiment.

FIGS. 8(a) and 8(b) each are a schematic diagram showing the structure of a liquid crystal film 40' that constitutes the optical low-pass filter 4 used in the camera shown in FIG. 1. FIG. 8(a) is a plan view and FIG. 8(b) is an A-A cross-section. The liquid crystal film 40' is made of ultraviolet-curing liquid crystal that is cured upon irradiation with ultraviolet rays. The liquid crystal molecules 400 contained in the liquid crystal have properties of monoaxial index ellipsoids. In the liquid crystal film 40', two types of rectangular areas 40a and 40b having different alignment directions of the liquid crystal molecules 400 (that is, alignment directions of index ellipsoids) are in an alternately repeated fashion disposed in the x direction and the y direction in a checkered pattern.

As shown in the cross-section shown in FIG. 8(b), the alignment direction of the liquid crystal molecules 400 in the area 40a is along the x direction and is substantially parallel to the substrate surface (xy plane). On the other hand, the liquid crystal molecules 400 in the area 40b are aligned in the y direction and are disposed substantially in parallel to the substrate surface. Note that here a homogenous alignment is adopted such that the liquid crystal molecules 400 are substantially parallel to the substrate surface. However, the liquid crystal molecules 400 may be tilted in the direction of top and bottom to some extent. In the case of the liquid crystal having optical anisotropy of a monoaxial index ellipsoid, the alignment direction of the index ellipsoid is approximately identical with the alignment direction of the liquid crystal molecules 400. The liquid crystal film 40' is obtained by aligning the liquid crystal molecules 400 in the direction as shown in FIG. 8(b) and irradiating ultraviolet rays to the liquid crystal to cure it.

Figure 9:
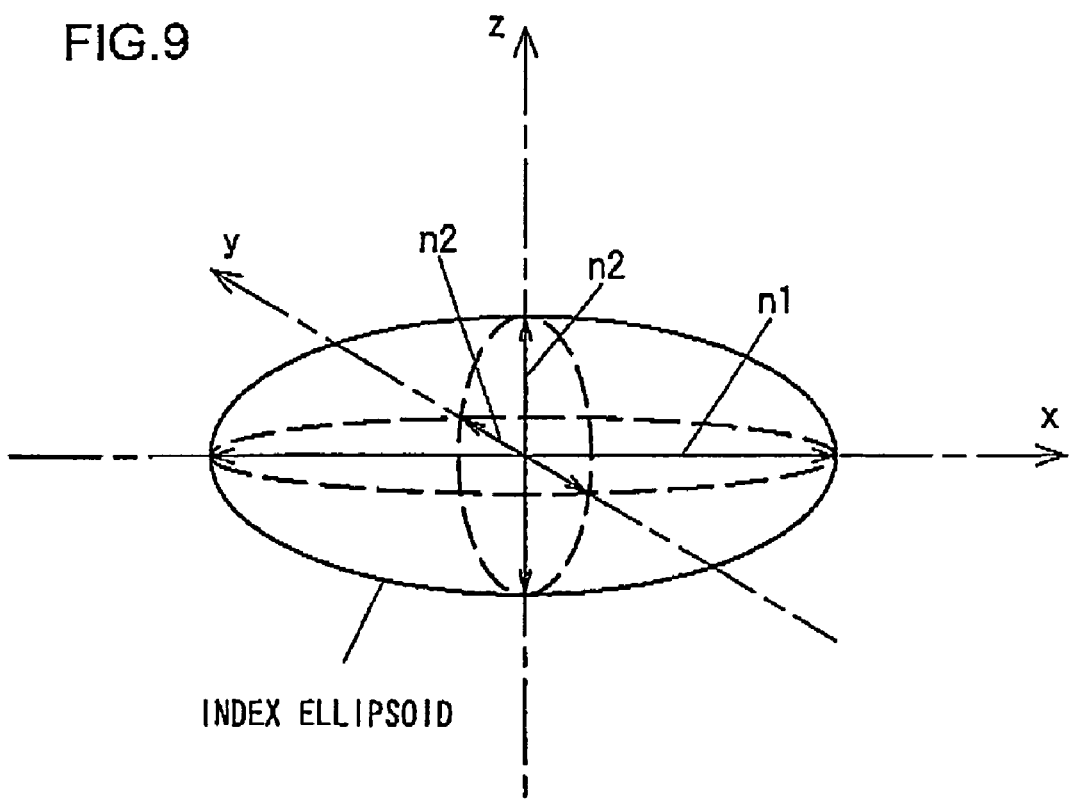
FIG. 9 is a diagram illustrating an index ellipsoid.

The index ellipsoid is in the form of a spheroid as shown in FIG. 9. Its diameter in the direction of rotation axis (x axis direction) indicates an extraordinary refractive index n1 and its diameters in directions perpendicular to the rotation axis (y axis direction, z axis direction) indicate an ordinary refractive index n2. Note that the index ellipsoid shown in FIG. 9 represents one that is related to the area 40a in FIG. 8(b) and it is assumed that ny=nz and n1>n2. In the area 40b, the longer axis of the index ellipsoid is oriented in the y direction.

When a light is incident into the area 40a along the direction of z plus, the liquid crystal film 40 has a refractive index n1 for linearly-polarized light that oscillates in the x direction and a refractive index n2 for linearly-polarized light that oscillates in the y direction. On the other hand, in the area 40b, the liquid crystal film has a refractive index n1 for the linearly-polarized light that oscillates in the y direction and a refractive index n2 for the linearly-polarized light that oscillates in the x direction contrary to the area 40a. There occurs a diffractive action for two polarized lights of the incident light that are perpendicular to each other. In other words the liquid crystal film 40 functions as a diffractive grating regardless of the direction of polarization of the incident light.

That is, a phase difference of $t \cdot (n1-n2)$ occurs between the light having passed through the area 40a and the light having passed through the area 40b. Here, t indicates a thickness of the liquid crystal film 40. If the phase difference is set to be a half of the wavelength of the light as shown in the expression (5) below, zero-order diffracted light becomes null and the liquid crystal film 40 functions as a low-pass filter due to separation of light flux into ±1st-order diffracted lights. In the expression (5), k is a natural number of 0, 1, 2, 3, 4, . . . .

$$t=(k+1/2)\lambda/|n1-n2| \quad (5)$$

For example, when n1−n2=0.1 and wavelength λ of light is λ=540 nm, the thickness t is 2.7 μm for k=0. Note that ±2nd-order or higher-order diffracted lights are also generated. However, their intensities are very low, so that it may be considered that the optical low-pass filter is based substantially on the ±1st-order diffracted lights. Since the areas 40a and 40b are alternately disposed along the x direction and the y direction in the liquid crystal film 40, the light flux is separated in two directions, i.e., the x direction and the y direction.

Next, the width of separation of a light flux caused by the optical low-pass filter 4 is described with reference to FIGS. 10(a) and 10(b). In the first embodiment, it is assumed that pixels in the image sensor 2 are disposed in the x direction and in the y direction in the form of a matrix and the optical low-pass filter 4 separates a light flux along the direction in which the pixels are disposed. That is, the light flux 20 incident to the optical low-pass filter 4 via the photographic lens 5 is separated by the optical low-pass filter 4 into two directions, i.e., the x direction and the y direction. The separated light fluxes are incident to the imaging plane of the image sensor 2 through the cover glass 3.

FIG. 10(b) illustrates the positional relationship between the separated light fluxes 20A to 20D on the imaging plane and the disposition of the areas 40a and 40b. When the areas 40a and 40b are disposed in the xy directions as shown in FIG. 8(a), the direction in which the light flux is separated will be separated into a cross shape. On the other hand, since the direction in which the pixels on the image sensor 2 is disposed is in the xy directions, it is necessary to dispose the liquid crystal film 40 such that the area 40b is positioned at 45 degrees with respect to the area 40a as shown in FIG. 10(b) in order for four light fluxes after separation to be positioned at the vertices of a square in compliance with the disposition of the pixels.

Assuming that the areas 40a and 40b each are a square having a side length of d, the length d depends on a separation angle θ to be required for the optical low-pass filter 4 (see FIG. 10(a)). There is a relationship indicated by the following expression (6) between the length d and the separation angle θ. Accordingly, a designing method is adopted in which the pixel pitch p is set to be equal to the Nyquist frequency of the optical low-pass filter 4.

$$d=\lambda/\tan\theta \quad (6)$$

Assuming that the cover glass 3 has a thickness t2 and a refractive index of nd and the distance between the optical low-pass filter 4 and the imaging plane is L, an optical distance L′ from the optical low-pass filter 4 to the imaging plane is expressed by the following expression (7). As a result, the expression (6) is transformed into the expression (8).

$$L' = t2 + (L - t2) \cdot nd \quad (7)$$

$$d = 2\lambda \cdot L'/h \quad (8)$$
$$= 2\lambda \cdot (t2 + (L - t2) \cdot nd)/h$$

Since the direction of separation is slanted by 45 degrees as shown in FIG. 10(b), the separation width is h=p√2. Assuming that the pixel pitch p=2 μm, the distance L=1 mm, the thickness of the cover glass 3 t2=0.5 mm, and the refractive index nd=1.5, and λ=540 nm, then h=2√2. The repetition pitch of the areas 40a and areas 40b, that is, a side length d of the square areas 40a and 40b is d≈0.477 mm. That is, the repetition pitch p is set in compliance with the separation width required by the distance between the optical low-pass filter 4 and the image sensor 2, and the pixel pitch p on the image sensor 2.

As mentioned above, in the case of the optical low-pass filter 4 according to the second embodiment, the areas 40a and 40b, in which the liquid crystal molecules 400 are aligned in respective alignment directions that are perpendicular to each other, are disposed alternately in a checkered pattern in the same liquid crystal layer. Therefore, catching of the grating pattern in the imaging plane that would otherwise occur in the conventional optical low-pass filter produced by utilizing a concavo-convex relief die can be prevented.

[Method for Producing Liquid Crystal Film 40']

Figure 11:
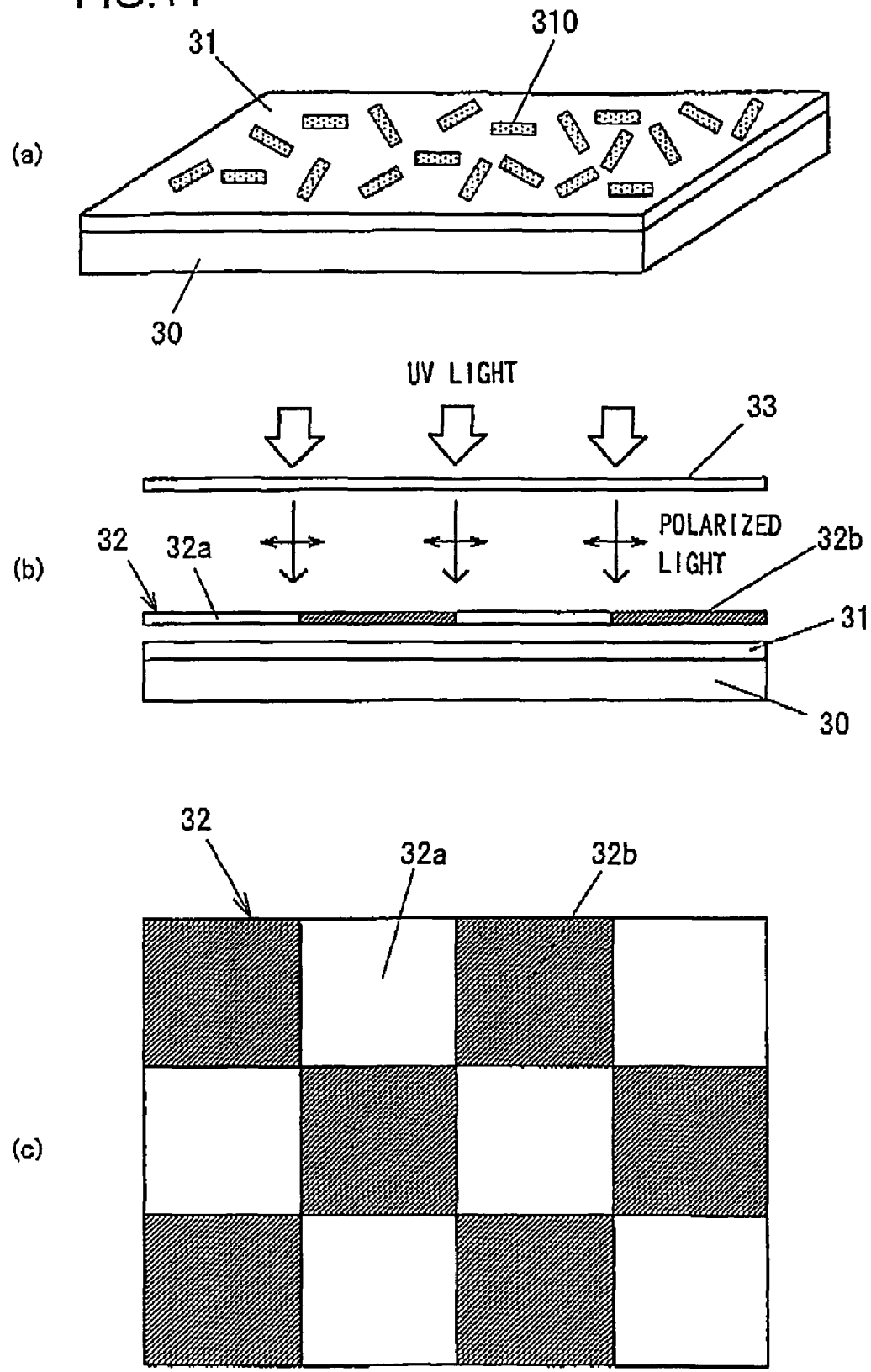
FIGS. 11(a) to 11(c) each are a diagram illustrating a method for producing a liquid crystal film, with FIG. 11(a) illustrating the first step, FIG. 11(b) illustrating the second step, and FIG. 11(c) presenting a plan view of the mask.

Next, a method for producing the liquid crystal film 40' is roughly explained. First, in a first step illustrated in FIG. 11(a), a film of a photoaligning agent containing a compound having a photoreactive functional group (hereafter, referred to as "photoaligning film") 31 is formed on the planar substrate 30. In this point in time, photoaligning molecules 310 in a photoaligning film 31 is in an at random direction. In a second step as illustrated in FIG. 11(b), the photoaligning film 31 is exposed with ultraviolet rays which is polarized through the mask 32 to align the photoaligning molecules 310.

Ultraviolet rays are irradiated to the mask 32 through a polarization plate 33 and polarized light that is polarized in the direction of left and right in the figure only transmits the polarization plate 33. FIG. 11(c) is a plan view of the mask 32, showing that square ultraviolet-transmitting areas 32a and square ultraviolet-non-transmitting areas 32b are disposed in a checkered pattern. As a result, the polarized ultraviolet rays are irradiated only to the areas that correspond to the transmitting areas 32a of the photoaligning film 31. In the areas to which the polarized ultraviolet rays are irradiated, the photoaligning molecules 310 in the photoalignment film 31 are caused to undergo an anisotropic chemical reaction.

Figure 12:
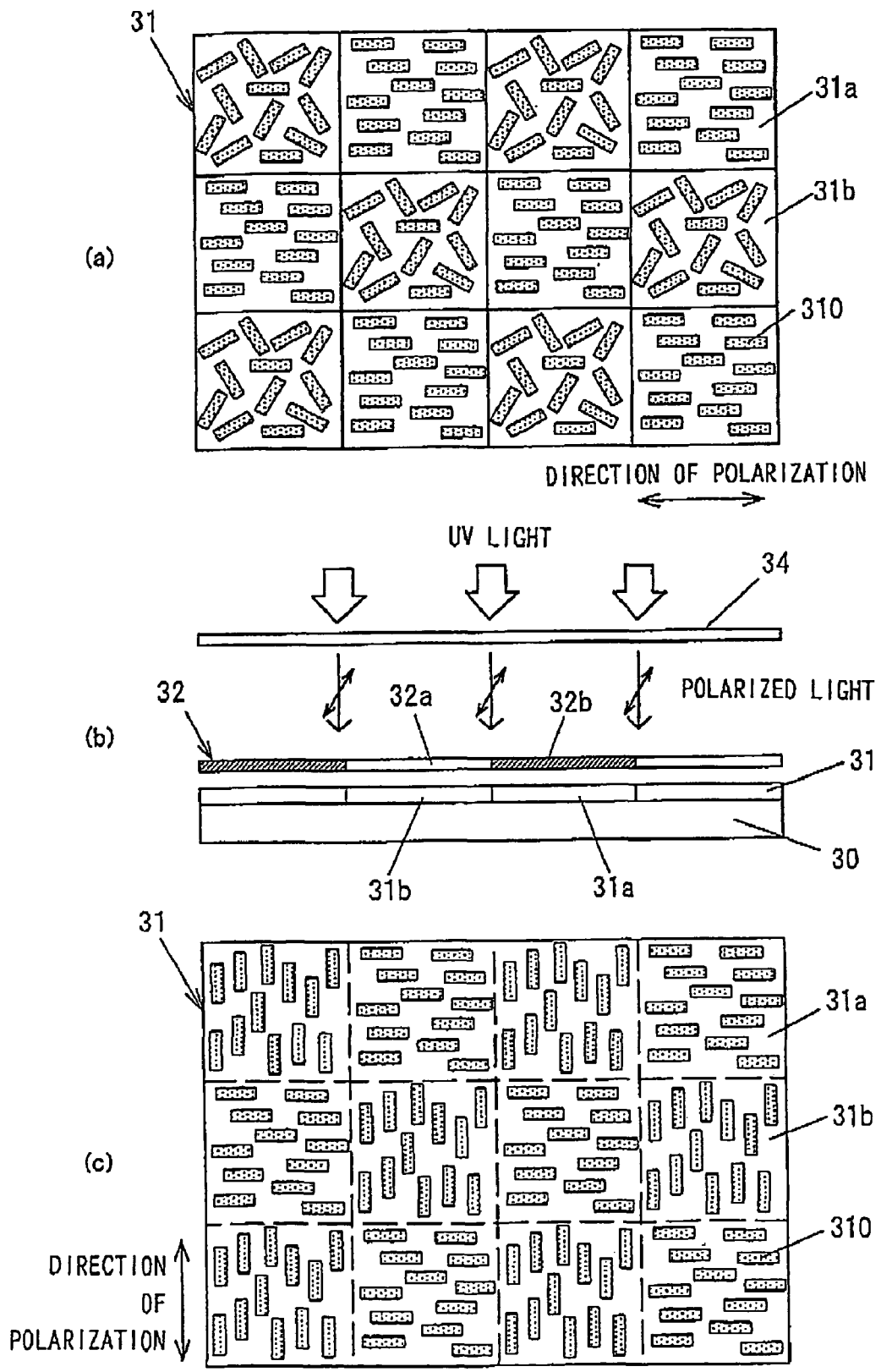
FIGS. 12(a) to 12(c) each are a diagram illustrating a method for producing a liquid crystal film, with FIG. 12(a) presenting a plan view of a photoaligning film, FIG. 12(b) presenting a cross-sectional view illustrating the third step, and FIG. 12(c) presenting a plan view of the photoaligning film after irradiation of ultraviolet rays.

FIG. 12(a) is a plan view of the photoalignment film 31, which schematically shows the state of the photoaligning molecules 310 after the irradiation with ultraviolet rays. The areas 31a each are an area to which ultraviolet rays are irradiated, so that the photoaligning molecules 310 are aligned along the direction of polarization of the ultraviolet rays. On the other hand, the photoaligning molecules 310 in the area 31b to which ultraviolet rays are not irradiated as shielded by the non-transmitting areas 32b remain randomly aligned.

FIG. 12(b) is a cross-sectional view illustrating a third step. In the third step, exposure with ultraviolet rays is performed by using a mask 32'. The mask 32' is a mask in which the transmitting areas 32a face the areas 31b of the photoaligning film 310 and the non-transmitting areas 32b face the areas 31a of the photoaligning film 310, thus constituting a mask that is complementary to the mask 32 shown in FIG. 11(c). Accordingly, the mask 32 can be used as a substitute for the mask 32' by using the mask 32 at a displaced position.

Upon irradiation with ultraviolet rays, a polarization plate 34 that transmits polarized light vertical to plane of paper is used and the polarized light that has transmitted the polarization plate 34 is irradiated to the photoaligning film 31. FIG. 12(c) shows the photoaligning film 31 after the irradiation with ultraviolet rays. Ultraviolet rays polarized in the direction of top and bottom are irradiated to the areas 31b. As a result, the photoaligning molecules 310 in the areas 31b are aligned in the direction of top and bottom in the figure.

Figure 13:
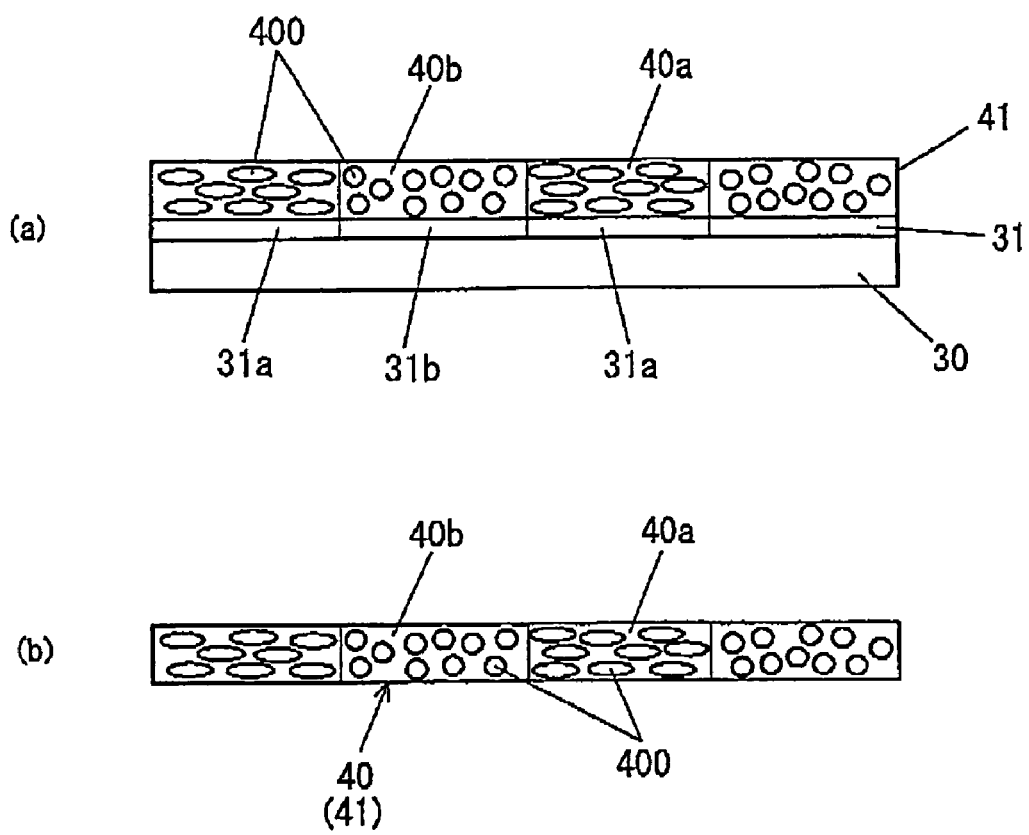
FIGS. 13(a) and 13(b) each are a diagram illustrating a method for producing a liquid crystal film, with FIG. 13(a) presenting a cross-sectional view illustrating the fourth step and FIG. 13(b) presenting a cross-sectional view showing the liquid crystal film.

FIG. 13(a) is a diagram illustrating a fourth step. In the fourth step, monomeric ultraviolet-curing liquid crystal is spread in the form of a film on the photoaligning film 31 to form a liquid crystal layer 41 and irradiate the liquid crystal layer 41 with ultraviolet rays to cure it. The photoaligning molecules 310 in the photoaligning film 31 are aligned in the direction of left and right in the figure in the areas 31a while in the areas 31b the photoaligning molecules 310 in the photoaligning film 31 are oriented in the direction perpendicular to plane of paper.

Since the liquid crystal molecules 400 of the liquid crystal layer 41 are aligned in the alignment direction of the photoaligning molecules 310 in the photoaligning film 31, the liquid crystal molecules 400 are aligned in the direction of left and right in the figure in the areas 40a above the area 31a. On the other hand, the liquid crystal molecules 400 in the areas 41b positioned above the area 31b are aligned in the direction perpendicular to plane of paper. Upon irradiation with ultraviolet rays, monomers are converted into a polymer and the alignment direction of the liquid crystal molecules 400 is fixed to a state shown in FIG. 13(a). By peeling the cured liquid crystal layer 41 from the substrate 30, a liquid crystal film 40 as shown in FIG. 13(b) is obtained.

Note that the liquid crystal layer 41 is formed by a method involving spreading a liquid crystal on the aligning film 31 to a predetermined thickness by using a coating device such as a spin coater. Here, the predetermined thickness means the thickness t2 of the above-mentioned liquid crystal film 40'. The exposure with ultraviolet rays may be either of a type in which the masks 32 and 32' are in contact with the exposure side or of a type in which an image of the mask is projected on the exposure plane by using an optical system.

Figure 14:
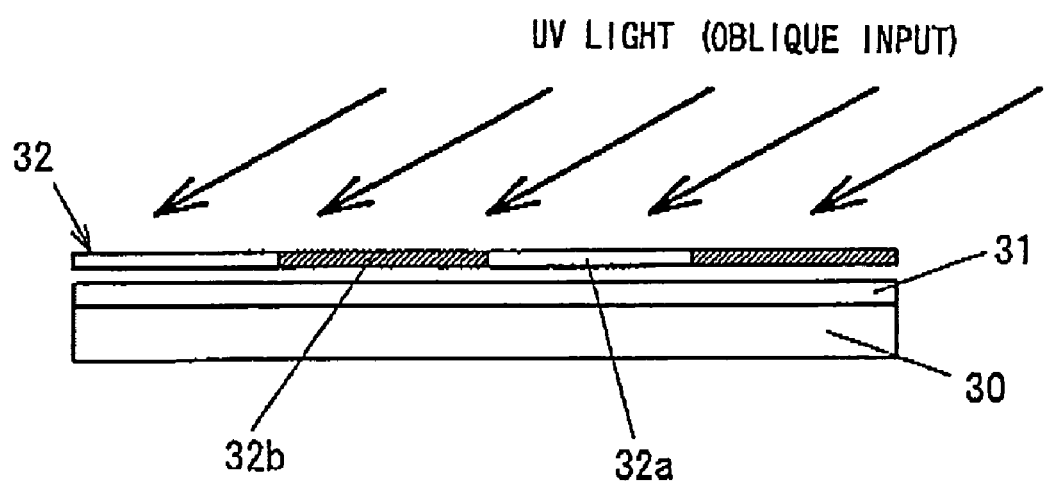
FIG. 14 is a diagram illustrating optical alignment by inputting ultraviolet rays obliquely.

In the above-mentioned second embodiment, the polarization plates 33 and 34 are used to orient the photoaligning molecules 310 of the photoaligning film 31 along a predetermined direction with linearly-polarized ultraviolet rays. However, similar photoaligning can be performed by allowing ultraviolet rays to enter the photoaligning film 31 obliquely as shown in FIG. 14 instead of using the linearly-polarized ultraviolet rays. In this case, for example, a film of a low-molecular azo dye derivative may be used as the photoaligning film 31. The ultraviolet rays are incident obliquely at approximately the Brewster angle.

[Modification 1]

In the above-mentioned embodiment, the liquid crystal film 40' is formed by curing the ultraviolet-curing liquid crystal and used as the optical low-pass filter 4. However, the liquid crystal may be injected into a space between a pair of transparent substrates disposed at a predetermined distance via a spacer like a conventional liquid crystal panel. In this case, the photoaligning film 31 is formed on one of the transparent substrates in advance and oriented as shown in FIG. 12(c). The liquid crystal to be used may be either an ultraviolet-curing type liquid crystal or a conventional nematic liquid crystal.

When the optical low-pass filter is of the type in which the nematic liquid crystal is used, it may be configured as shown in FIGS. 15(a) and 15(b) so that the low-pass function thereof can be switched ON or OFF. FIG. 15(a) shows a state in which the low-pass function is ON and FIG. 15(b) shows a state in which the low-pass function is OFF. On a surface of each of transparent substrates 51, such as glass substrates, there is formed an electrode 52 made of a transparent conductive film such as ITO (indium oxide doped with tin).

On the electrode 52 of any one of the transparent substrates 51 is formed the above-mentioned photoaligning film 31. The photoaligning film 31 is optically aligned as shown in FIG. 12(c) to form the areas 31a and 31b whose alignment directions are perpendicular to each other. Note that the alignment direction is in the direction of left and right in the figure in the areas 31a and in the direction perpendicular to plane of paper in the areas 31b. The transparent substrates 51 are disposed at a predetermined distance and the nematic crystal is injected into a space defined thereby to form a liquid crystal layer 50. A drive control unit 60 controls voltage to be applied to the electrodes 52, thereby controlling ON or OFF of the low-pass function of the optical low-pass filter 4.

FIG. 15(a) illustrates a case in which the low-pass function is turned ON. In this state the potential difference between the electrodes 52 is controlled to be null. For example, a state in which applied voltage=0 is established. On this occasion, liquid crystal molecules 500 are aligned by the photoaligning film 31 such that they are aligned in the direction of left and right in the figure in an area 50 facing the area 31a while they are aligned in the direction perpendicular to plane of paper in a portion facing the area 31b. As a result, the liquid crystal layer 50 operates as a diffractive grating.

On the other hand, FIG. 15(b) illustrates a case in which the low-pass function is turned OFF. A drive control unit 60 controls applied voltage such that a potential difference is generated between the electrodes 52. As a result, an electric field is generated in the liquid crystal layer 50 in the direction perpendicular to the substrate (in the direction of top and bottom in the figure) to align the liquid crystal molecules 500 in the direction perpendicular to the substrate. As a result the diffractive function of the liquid crystal layer 50 disappears.

As mentioned above, the optical low-pass filter 4 shown in FIGS. 15(a) and 15(b) can switch the function of low-pass filter ON or OFF. Accordingly, for example, when it is desired to capture an image having a resolution higher than is required for preventing moire, it is only necessary to perform imaging by turning OFF the low-pass function as shown in FIG. 15(b). This makes it possible for the photographer to cope with different subjects and different concepts of photography flexibly.

Figure 16:
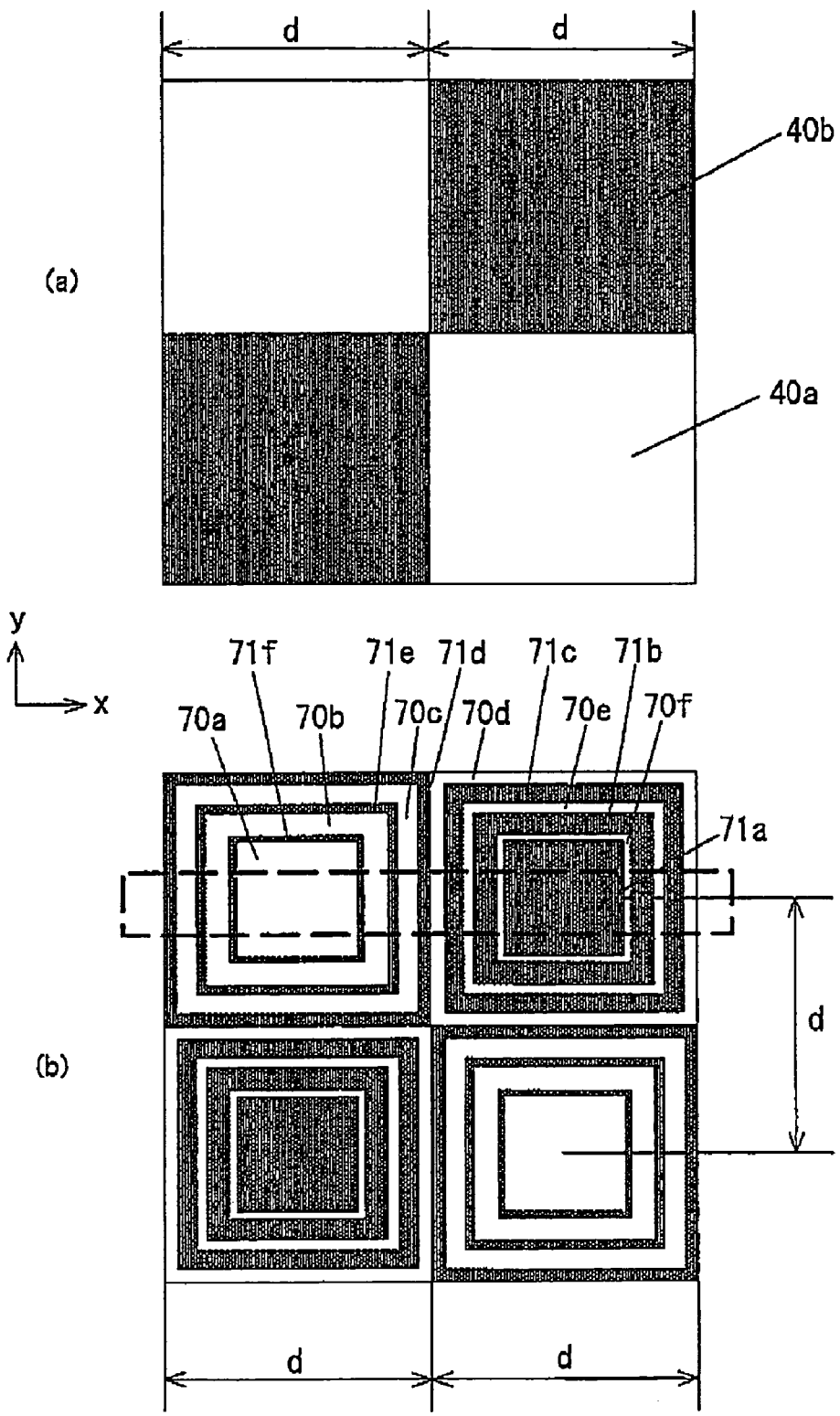
FIGS. 16(a) and 16(b) each are a diagram illustrating a second modification, showing the disposition patter of each area.

In the case of the optical low-pass filter 4 according to the above-mentioned second embodiment, square areas 40a and 40b having a side length of d are disposed in a checkered pattern as shown in FIG. 16(a). However, as shown in FIG. 16(b), areas 70a to 70f aligned in the x direction in the same manner as the areas 40a and areas 71a to 71f disposed in the y direction in the same manner as the areas 40b may be disposed in the x direction and in the y direction. The area 70a and the area 71a have the same shape but are disposed in different directions. The same will do for the areas 70b and 71b, the areas 70c and 71c, the areas 70d and 71d, the areas 70e and 71e, and the areas 70f and 71f. Note that the widths of respective areas 70a to 70f and 71a to 71f are the same in the x direction and in the y direction.

Figure 17:
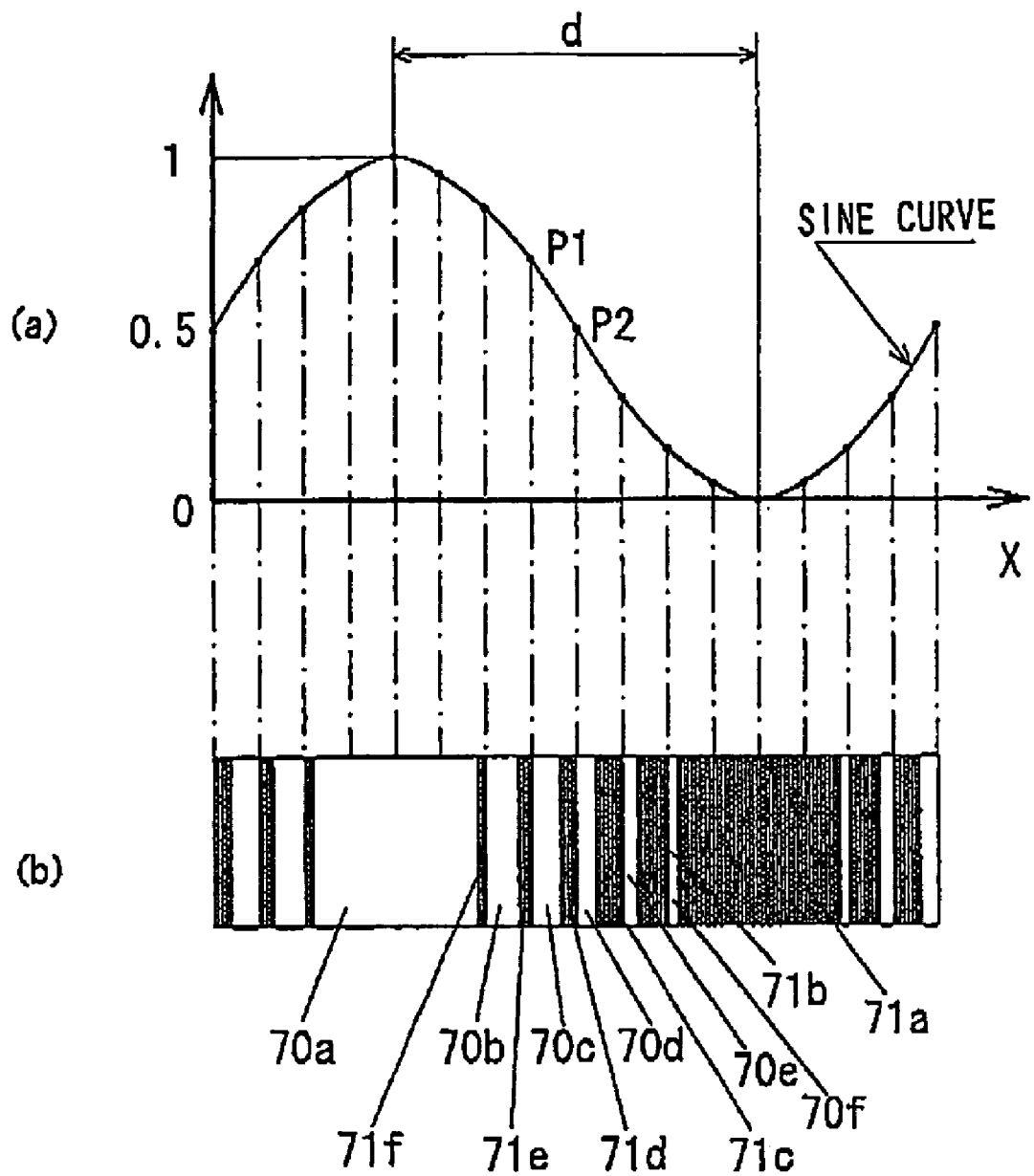
FIGS. 17(a) and 17(b) each are a diagram illustrating a sinusoidal disposition pattern, with FIG. 17(a) showing a sine curve and FIG. 17(b) showing a portion embraced by a broken line in FIG. 16(b).

FIG. 17(b) shows the portion embraced by the broken line in FIG. 16(b), indicating a disposition pattern in the x direction. On the other hand, FIG. 17(a) shows a sine curve with a frequency of 2d. In the pattern shown in FIG. 17(b), the widths of the respective areas 70a to 70f and 71a to 71f are set such that the ratio of widths of any adjacent two areas in which alignment directions are different from each other varies sinusoidally.

Here, the term "ratio of widths" means an amount represented by the following expression (9), for example, in the case of adjacent areas 70c and 71d, indicating an amount representing a ratio of the sum of widths of areas aligned in the x direction to the total width.

$$\text{Ratio}=(\text{width of area } 70c)/((\text{width of area } 71d)+(\text{width of area } 70c)) \quad (9)$$

This size is the same as the value of point P1 on the sine curve shown in FIG. 17(a). In the case of the areas 70d and 71d located at a distance d, which is half the frequency 2d of the sine curve, the ratio is 0.5 since the widths are equivalent to each other, so that it is the same value as that of point P2 on the curve.

In FIGS. 17(a) and 17(b), explanation has been focused on the x direction. However, a similar structure is adopted in the y direction. The disposition pattern shown in FIG. 16(b), like the disposition pattern shown in FIG. 16(a), forms a diffractive grating having the pitch d. In this manner, conversion of the rectangular wave-like disposition pattern shown in FIG. 16(a) into the sine curve-like disposition pattern shown in FIG. 16(b) results in an increase in the efficiency of diffraction of first-order light to increase the effect of the optical low-pass filter 4 and a decrease in higher-order lights. As a result, a decrease in MTF can be suppressed. Further, it is possible to apply the sine curve-like disposition pattern also to the optical low-pass filter 4 according to the above-mentioned first embodiment and determine the widths of respective areas according to the above-mentioned expression (9).

The operational effects of the above-mentioned second embodiment are summarized as follows.

(1) The areas 40a in which the liquid crystal is aligned in the first direction that is parallel to the direction in which the liquid crystal layer 41 extends and the areas 40b in which the liquid crystal is aligned in the second direction that is perpendicular to the direction in which the liquid crystal layer 41 are disposed in an alternately repeated fashion along the direction in which the liquid crystal layer 41 extends to form the optical low-pass filter 4. As a result, the grating pattern can be prevented from being caught in the imaging plane.

(2) An attempt of die-forming a phase diffractive grating having formed with a relief of concaves and convexes would result in an increase in cost because of difficulty in forming the die since the dimension of the concaves and convexes is on the order of wavelength. On the other hand, the optical low-pass filter 4 in the second embodiment can be produced without difficulty to achieve cost reduction since it is produced by curing the areas 40a and 40b of the liquid crystal layer 41 having a uniform thickness with ultraviolet rays.

(3) It is preferred that the thickness of the liquid crystal layer 41 is determined based on the difference between the ordinary refractive index and extraordinary refractive index of monoaxial crystal, and wavelength of an incident light flux. The alignment of liquid crystal can be performed without difficulty by forming the liquid crystal layer 41 on the aligning film 31 in which the area 31a for aligning in the first direction and the area 31b for aligning in the second direction are disposed in an alternately repeated fashion.

(4) As shown in FIGS. 15(a) and 15(b), the liquid crystal layer 50 may be a nematic liquid crystal sandwiched between a pair of the substrates 51 each being provided with the electrode 52. The function of the optical low-pass filter can be switched ON or OFF by controlling voltage applied to the electrodes 52 by the drive control unit 60.

(5) Setting the ratio of widths of the areas 70a to 70f to those of the areas 71a to 71f alternately disposed to vary sinusoidally increases the efficiency of diffraction of first-order light, thus increasing the effect of the optical low-pass filter 4 and decreasing higher-order lights. As a result, the decrease of MTF can be suppressed.

(6) The optical low-pass filer 4 can be produced without difficulty by forming a photoaligning agent on a substrate, exposing the photoaligning agent with light through the mask 32 provided with areas different in transmittance from each other, and further exposing to light areas in which the photoaligning agent has not yet been exposed to light to form a liquid crystal layer on the exposed photoaligning agent. It is also possible to align liquid crystal molecules by irradiation of ultraviolet rays in the state in which the liquid crystal layer has been formed on the photoaligning material. Note that it is of course possible to apply the method for producing the optical low-pass filter 4 according to the above-mentioned first embodiment to the method for producing the optical low-pass filter 4 according to the second embodiment.

In the above-mentioned second embodiment, a light flux is separated into two directions, i.e., into the x direction and the y direction by disposing the areas 40a and 40b in the x direction and in the y direction alternately. However, the light flux may be separated in one direction by alternately disposing the linear areas 40a and 40b in one direction (see FIG. 7(b)). In addition, instead of attaching the liquid crystal film 40' to the cover glass 3, the liquid crystal layer 41 may be formed directly on the surface of the cover glass 3. Note that the above-explanation is only exemplary and the present invention is not limited to the above-mentioned embodiments as far as the feature of the present invention is not damaged.

In the above description, various embodiments and modifications have been explained. However, the present invention is not limited thereto. Other modes that can be conceived within the scope of the technical concept of the present invention may also be included in the scope of the present invention.

The present application is based on Japanese Patent Application No. 2006-185153 (filed Jul. 5, 2006) and Japanese Patent Application No. 2006-252805 (filed Sep. 19, 2006) and disclosures of the base applications are herein incorporated by reference.

The invention claimed is:

1. An optical low-pass filter with a liquid crystal substrate including a layer of liquid crystal, comprising:
    a first liquid crystal part in which the liquid crystal is aligned along a first direction; and
    a second liquid crystal part in which the liquid crystal is aligned along a second direction different from the first direction, wherein
    the first liquid crystal part and the second liquid crystal part are disposed in an alternately repeated fashion; and
    the liquid crystal comprises liquid crystal molecules of a monoaxial index ellipsoid.

2. An optical low-pass filter according to claim 1, wherein:
    phases of linearly-polarized lights that transmit the first liquid crystal part and the second liquid crystal part, respectively are shifted by a half wavelength.

3. An optical low-pass filter according to claim 1, wherein:
    a plurality of the optical low-pass filters is disposed in superposition one on another such that directions along which the first liquid crystal parts are aligned or directions along which the second liquid crystal parts are aligned are perpendicular to each other.

4. An optical low-pass filter according to claim 1, wherein:
the layer of the liquid crystal comprises a nematic liquid crystal sandwiched by a pair of substrates each of which is formed with an electrode.

5. An optical low-pass filter according to claim 4, further comprising:
a control circuit that controls voltage applied to the electrodes.

6. An imaging apparatus, comprising:
an optical low-pass filter according to claim 1; and
a light receiving element that receives imaging light through the optical low-pass filter.

7. An imaging apparatus according to claim 6, wherein:
pitches of adjacent different liquid crystal parts in the liquid crystal substrate are set according to a width of separation required based on a distance between the optical low-pass filter and the light receiving element and a pixel pitch of the light receiving element.

8. An imaging apparatus according to claim 6, wherein:
a plurality of the optical low-pass filters is provided for each of linearly-polarized lights that are perpendicular to each other.

9. A camera, comprising:
an optical low-pass filter according to claim 1; and
an image sensor that receives subject light through the optical low-pass filter.

10. A camera according to claim 9, wherein:
a plurality of the optical low-pass filters is provided for each of linearly-polarized lights that are perpendicular to each other.

11. An optical low-pass filter with a liquid crystal substrate including a layer of liquid crystal, comprising:
a first liquid crystal part in which the liquid crystal is aligned along a first direction; and
a second liquid crystal part in which the liquid crystal is aligned along a second direction different from the first direction, wherein
the first liquid crystal part and the second liquid crystal part are disposed in an alternately repeated fashion;
the liquid crystal is optically a monoaxial crystal and a thickness of the layer of the liquid crystal is determined based on a difference between an ordinary refractive index and an extraordinary refractive index of the monoaxial crystal and a wavelength of an incident light flux.

12. An optical low-pass filter according to claim 11, wherein:
the layer of the liquid crystal is formed on an aligning film in which a portion where the liquid crystal is aligned in the first direction and a portion where the liquid crystal is aligned in the second direction are disposed in an alternately repeated fashion.

13. An optical low-pass filter with a liquid crystal substrate including a layer of liquid crystal, comprising:
a first liquid crystal part in which the liquid crystal is aligned along a first direction; and
a second liquid crystal part in which the liquid crystal is aligned along a second direction different from the first direction, wherein
the first liquid crystal part and the second liquid crystal part are disposed in an alternately repeated fashion; and
a ratio of widths of the alternately disposed liquid crystal parts is set to vary sinusoidally.

14. A method for producing an optical low-pass filter, the method comprising:
disposing a first liquid crystal part and a second liquid crystal part on a liquid crystal substrate including a layer of a liquid crystal in an alternately repeated fashion with directions along which the liquid crystal is aligned being different from one another;
a first step of bringing liquid crystal molecules of monoaxial index ellipsoid included in an ultraviolet-curing liquid crystal into a first alignment state to provide the first liquid crystal part;
a second step of irradiating ultraviolet rays to the ultraviolet-curing liquid crystal using a mask that partially transmits ultraviolet rays to form a cured area and a non-cured area; and
a third step of bringing the liquid crystal molecules in the non-cured area into a second alignment state and curing the non-cured area by irradiation of ultraviolet rays to provide the second liquid crystal part.

15. A method for producing an optical low-pass filter according to claim 14, wherein:
any one of the first and the second alignment states is a nonaligned state in which liquid crystal molecules in the area are aligned in an at random direction.

16. A method for producing an optical low-pass filter according to claim 14, wherein
in the second step, the ultraviolet rays are irradiated through one of a mask in which a part transmitting ultraviolet rays and a part shielding ultraviolet rays are disposed in a checkered pattern or a gradation mask of which ultraviolet transmittance gradually varies along a mask surface.

17. A method for producing an optical low-pass filter, the method comprising:
disposing a first liquid crystal part and a second liquid crystal part on a liquid crystal substrate including a layer of a liquid crystal in an alternately repeated fashion with directions along which the liquid crystal is aligned being different from one another;
a first step of forming a photoaligning agent on a substrate;
a second step of exposing the photoaligning agent to light through a mask in which areas having different transmittances corresponding to the first liquid crystal part and the second liquid crystal part, respectively, are alternately disposed;
a third step of exposing an area of the photoaligning agent that has not been exposed in the second step; and
a fourth step of forming a layer of liquid crystal on the photoaligning agent.

* * * * *